(12) United States Patent
Hirabayashi et al.

(10) Patent No.: US 6,415,204 B1
(45) Date of Patent: Jul. 2, 2002

(54) ASSEMBLING DEVICE AND TRAY SYSTEM USED THEREIN, AND DESIGN ASSISTING DEVICE

(75) Inventors: Michio Hirabayashi; Katsuhisa Ida; Nobuo Higuchi; Yoshihito Sugano; Yoshihiko Nakanishi; Hiromi Kitaura; Kenichi Kuruma; Hiroyuki Hayashi, all of Osaka (JP)

(73) Assignee: Idec Izumi Corporation, Osaka (JP)

(*) Notice: Subject to any disclaimer, the term of this patent is extended or adjusted under 35 U.S.C. 154(b) by 0 days.

(21) Appl. No.: 09/762,935
(22) PCT Filed: Jun. 12, 2000
(86) PCT No.: PCT/JP00/03821
§ 371 (c)(1), (2), (4) Date: Feb. 14, 2001
(87) PCT Pub. No.: WO00/76720
PCT Pub. Date: Dec. 21, 2000

(30) Foreign Application Priority Data

Jun. 14, 1999 (JP) .............................. 11-166775

(51) Int. Cl.⁷ .............................................. G06F 19/00
(52) U.S. Cl. .................. 700/245; 700/248; 700/249; 409/202; 409/212; 409/219; 409/221; 409/225; 29/430; 29/791; 901/1; 901/41; 701/23
(58) Field of Search .................... 700/245, 248, 700/249; 701/23; 409/219, 225, 202, 212, 221; 29/33 K, 430, 791, 34 B, 711; 901/1, 41

(56) References Cited

U.S. PATENT DOCUMENTS 5,653,005 A  * 8/1997 Speller et al. .......... 264/297.2
6,163,946 A  * 12/2000 Pryor ..................... 29/407.04
6,167,607 B1 * 1/2001 Pryor ......................... 473/588
6,301,763 B1 * 10/2001 Pryor ..................... 29/407.04
6,314,631 B1 * 11/2001 Pryor ..................... 29/407.04

FOREIGN PATENT DOCUMENTS

| EP | 0 704 780 | 4/1996 |
|----|-----------|--------|
| JP | 59-115185 | 7/1984 |
| JP | 62-152628 | 7/1987 |
| JP | 1-240293  | 9/1989 |
| JP | 5-286522  | 11/1993 |
| JP | 6-190664  | 7/1994 |
| JP | 7-281721  | 10/1995 |
| JP | 8-169511  | 7/1996 |
| JP | 8-185545  | 7/1996 |
| JP | 8-187688  | 7/1996 |
| JP | 8-290350  | 11/1996 |

* cited by examiner

Primary Examiner—William A. Cuchlinski, Jr.
Assistant Examiner—McDieunel Marc
(74) Attorney, Agent, or Firm—McDermott, Will & Emery

(57) ABSTRACT

A robots (210A, 210B), which is fixed onto a base (20, 20B) having a rectangular shape, has a mechanical hand (211A, 211B). A plurality of robot tools, each of which is freely attached to the tip of the mechanical hand (211A, 211B) for pinching a part, and a plurality of trays (6) each containing assembling jigs to be used for assembling parts, are brought in a movable range (RA, RB) of the robot, and the assembling tools are set at a predetermined position within the movable range (RA, RB). Then, an assembling job for the parts is carried out by using the assembling tools thus set. With this arrangement, the exchanging processes of the assembling tools can be carried out without depending on the human hands, even when the type of the assembly product is changed. Consequently, it becomes possible to efficiently carry out the manufacturing process of a small number of many types of products.

12 Claims, 28 Drawing Sheets

FIG. 17(a)
FIG. 17(b)
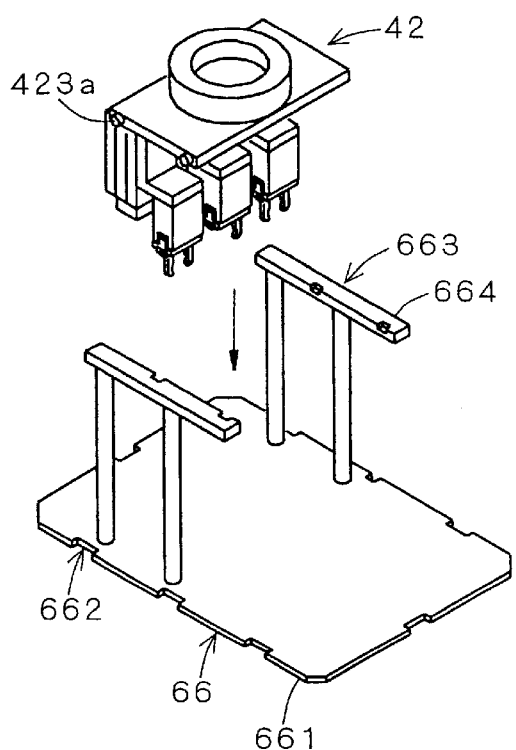
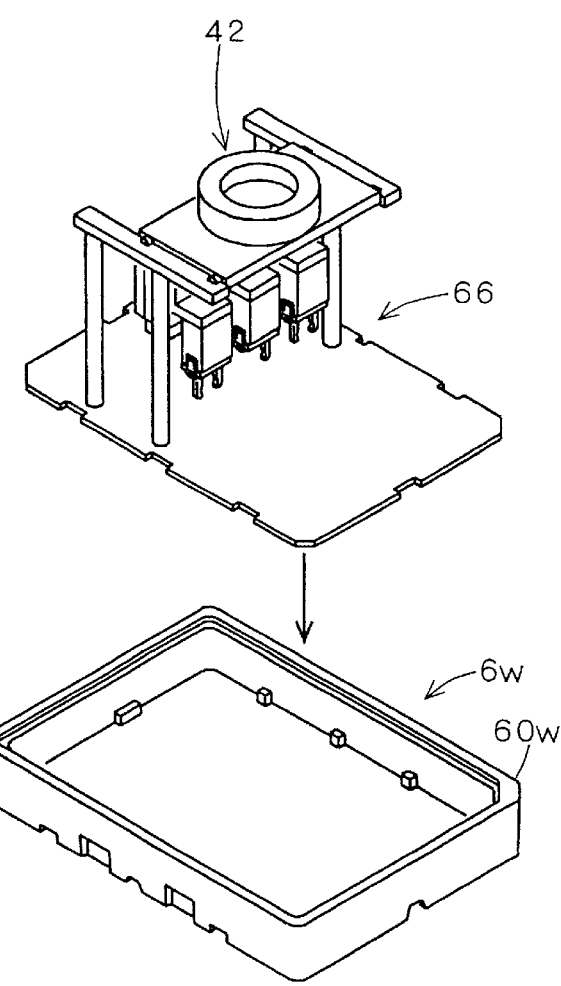

ASSEMBLING DEVICE AND TRAY SYSTEM USED THEREIN, AND DESIGN ASSISTING DEVICE

FIELD OF THE INVENTION

The present invention relates to an assembling technique for assembling an assembly product that is constituted by a plurality of parts, and more particularly concerns an assembling technique using a robot.

BACKGROUND OF THE INVENTION

In an assembling device for automatically assembling an assembly product that is constituted by a plurality of parts by using a robot, a plurality of parts are automatically supplied within a movable range of the robot so that at the time of the parts supply, the robot is stopped; thus, it is possible to eliminate the necessity of exchanging the parts by the human hands.

Moreover, a plurality of robots are fixed onto a single base so as to operate them in cooperation with one another, and a plurality of parts are assembled by using assembling jigs; thus, an attempt has been made to efficiently assemble the parts.

However, in the above-mentioned conventional technique which only automatically supplies a plurality of parts inside the movable range of a robot, in a case of an assembling device for aiming to produce a small number of many types of products, when switching processes between types of assembly products are frequently carried out, the exchanges of the corresponding assembling tools (robot tools, assembling jigs) also need to be frequently carried out. Here, since the exchanging processes of these assembling tools are carried out by the human hands, the exchanging jobs consume time, and during this time, the assembling device has to be stopped, resulting in a reduction in the rate of operation of the assembling device.

Moreover, this method in which a plurality of robots are fixed onto a single base, in an assembling device for aiming to produce a small number of many types of products, it is difficult to readily deal with changes in the layout of the robots and extra installations of robots following a great degree of switchovers in the types of assembly products.

DISCLOSURE OF THE INVENTION

Objective of the Present Invention

The present invention has been devised to solve the above-mentioned problems, and its objective is to provide an assembling technique for efficiently producing a small number of many types of products by using a robot.

Constitution and Function of the Invention

An assembling device of the present invention, which successively assembles a plurality of parts by utilizing assembling tools so as to manufacture a predetermined assembly product, is provided with: (a) an assembling section having a robot placed on a predetermined base, (b) a robot controlling means for driving and controlling the robot, (c) a transport means which transports the plurality of parts and the assembling tools from the outside of a movable range of the robot to inside of the movable range as bringing-in objects and also transport a finished assembly product and a used assembling tool from inside of the movable range to the outside of the movable range as taking-out objects, and in this arrangement, the robot control means is provided with (b-1) a tool management control means for allowing the robot to carry out a setting process of the assembling tools that have been brought therein and a returning operation of the used assembling tools to the transport means and (b-2) an assembling control means for allowing the robot to carry out an assembling process of the plurality of parts that have been brought therein and a returning operation of the finished assembly product to the transport means.

With this arrangement, since the exchanging processes of the assembling tools are carried out without depending on the human hands, it is possible to efficiently carry out the manufacturing process of a small number of many types of products.

More specifically, the assembling tools include a robot tool that is detachably attached to a tip of an arm of the robot, and an assembling jig that is placed on a workbench added to the base and that assembles the plurality of parts, and the tool management control means is preferably provided with a robot tool management control means for allowing the robot to attach and detach the robot tool to and from the tip of the arm and a jig management control means for allowing the robot to shift the assembling jig between a predetermined assembling position on the workbench and the above-mentioned transport means.

With this arrangement, it becomes possible to positively supply the robot tools and assembling jigs that are required for the assembling process.

More preferably, a plurality of types of robot tools are transported by the transport means, and the robot tool management control means is provided with a robot-tool transport control means for transporting the plurality of types of the robot tools to a predetermined robot-tool stand-by position on the base by using the robot, and a robot-tool exchange control means for selecting a robot tool to be attached to the tip of the arm among the plurality of types of robot tools so as to exchange a corresponding robot tool, in accordance with each stage of the assembling processes of the assembly product.

With this arrangement, an appropriate robot tool can be selected for each stage of the assembling processes.

More preferably, the transport means is provided with (c-1) a parallel arrangement of a plurality of tray holding sections, each capable of holding the corresponding tray, and (c-2) a transport driving means for shifting each of the plurality of tray holding sections between the inside of the robot movable range and the outside thereof, and each of the bringing-in objects and the taking-out objects is transported by the transport means in a housed state in the tray.

With this arrangement, the application of the trays makes it possible to carry out a superior general-purpose transporting operation.

More preferably, the plurality of tray holding sections are arranged side by side with a pair of a first tray for holding a tray having a predetermined unit width and a second tray for holding a tray having a width several times as large as the unit width.

This arrangement makes it possible to carry out a transporting process that is suitable for the various sizes of the bringing-in objects and taking-out objects.

Preferably, the tray has a first local shape on the outer surface thereof, and each tray holding section has a second local shape that fits into the first local shape so that each tray is positioned onto each tray holding section by the fitting-in state between the first local shape and the second local shape.

With this arrangement, it is possible to position each tray correctly.

More preferably, a chuck, which can pinch each of the plurality of parts, is used as the robot tool, and in a section within an operational range of the robot, from each of the respective bring-in positions of the plurality of parts to the assembling position, each transport path in a single direction for each of the parts, traced by the robot, is allowed to pass through a predetermined common position, and the assembling device is further provided with (d) a parts detection means, placed in a vicinity of the common position, for detecting whether or not the chuck on the robot is pinching any part.

With this arrangement, it is possible to readily detect whether or not the chuck is pinching any part.

Moreover, the present invention, which relates to an assembling device for fabricating an assembly product by successively assembling a plurality of parts, also concerns an assembling device which is provided with (a) a plurality of robot sections, each constituted by a robot and a base having a rectangular flat face on which the robot is placed, that are aligned with sides of the rectangular shape facing each other, and (b) a workbench aligned between the plurality of robot sections, with each of the movable ranges of robots of respective robot sections is allowed to cover at least one portion of each of the workbench adjacent to the robot section.

In this arrangement, since the layout of the robots is readily changed in response to a changeover between the types of assembly products, it is possible to efficiently produce a small number of products in many types.

More preferably, among the robot sections, respective robots on the adjacent two robot sections are allowed to have different combinations in the degree of freedom in operation.

This arrangement makes it possible to increase variations in the assembling job made by the robots.

Moreover, the present invention relates to a tray system used in an assembling device, which is provided with (a) a group of tray main bodies, and (b) a group of holding members, each of which has a predetermined upper surface recessed section that is allowed to fit to the shape of an object to be housed, and is housed in the tray main body so as to hold the object to be housed while positioning it in the upper surface recessed section. Here, the group of the tray main bodies include (a-1) tray main bodies of a single size having a predetermined unit housing width and (a-2) tray main bodies of a double size having double the unit housing width, and the group of the holding members include (b-1) a set of holding members of a single size, each of which is alone fitted to the inside of the tray main body of the single size and housed therein, while any desired one of pairs of the holding members of the single size is housed inside the tray main body of the double size, and (b-2) holding members of a double size, each of which is alone fitted to the inside of the tray main body of the double size. Here, in the case when any desired one of the pairs of the holding members of the single size are housed in the tray main body of the double size, the tray main body and the desired one of the pairs of the holding members of the single size are positionally fitted to each other in the virtually same manner as in the case when the holding member of the double size is alone housed therein.

With this arrangement, the holding member of the single size is housed not only in the tray main body of the single size, but also in the tray main body of the double size, in a properly positioned state; thus, it is possible to commonly use the holding members of the single size.

Furthermore, the present invention also relates to a design assisting device which is used for designing an operation of an assembling device that manufactures a predetermined assembly product by successively assembling a plurality of parts by using a plurality of robots, and the design assisting device is provided with a data base in which a plurality of operation modules that classify and define handling operations of respective robots for each part are registered, an operation input means for specifying the robot to be used for each process and for selecting an operation module to be used for each process among a collection of operation modules registered in the data base, an execution timing calculation means for calculating the execution timing of an operation module selected for each assembling process in accordance with the execution sequence of the respective processes with respect to the plurality of robots, and a display control means for graphically displaying the sequence of execution timing on a predetermined display means along the time axis with respect to each of the robots.

With this arrangement, it is possible to easily input the operation for each assembling process, and also to visually confirm the execution timing of each process; therefore, it becomes possible to effectively assist the designing process for the production of a small number of products in many types.

More preferably, the device is further provided with a stand-by time calculation means for calculating a time zone during which each robot is maintained in a stand-by state in order to prevent interference with a previous process in the execution timing for respective operation modules, and a stand-by time display controlling means for graphically displaying the stand-by time zones in a manner distinguished from other time zones.

Thus, it becomes possible to positively confirm the time zone during which the robot needs to be maintained in a stand-by state.

BRIEF DESCRIPTION OF THE DRAWINGS

FIGS. 17(a) and 17(b) are drawings that show examples in which the robot tool 42 is placed on the tray.

BEST MODES FOR CARRYING OUT THE INVENTION

Structure of Essential Portion of Assembling System 1

Figure 1:
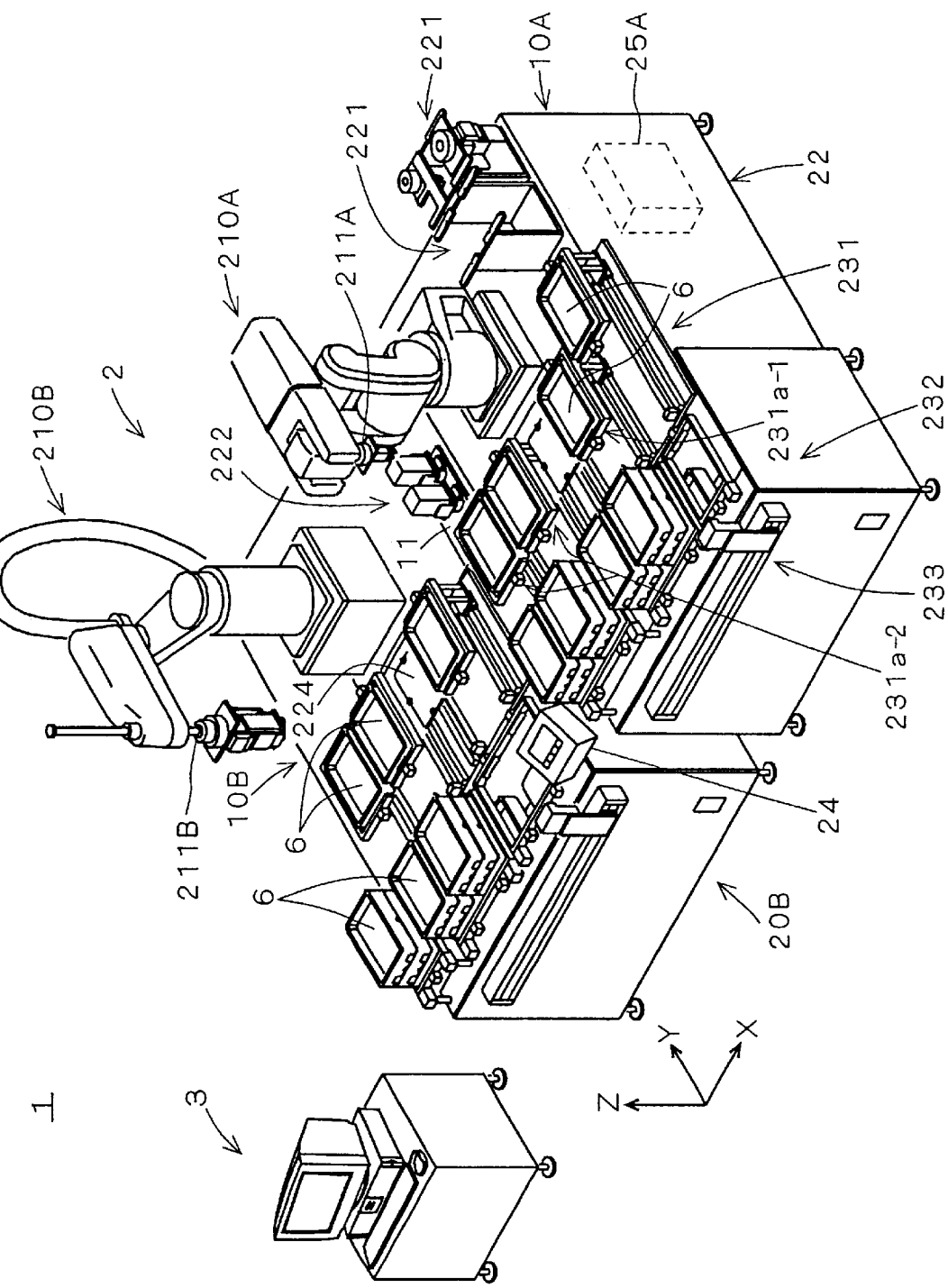
FIG. 1 is a conceptual perspective view that shows an assembling system 1 in accordance with one preferred embodiment of the present invention.

FIG. 1 is a perspective view that shows an assembling system 1 in accordance with one preferred embodiment of the present invention.

This assembling system 1 is mainly constituted by an assembling device 2, and a design assisting device 3 that is used in designing the operation sequence of the assembling device 2. First, the following description will discuss the structure of an essential portion of the assembling device 2.

Structure of Essential Portion of Assembling Device 2

Figure 2:
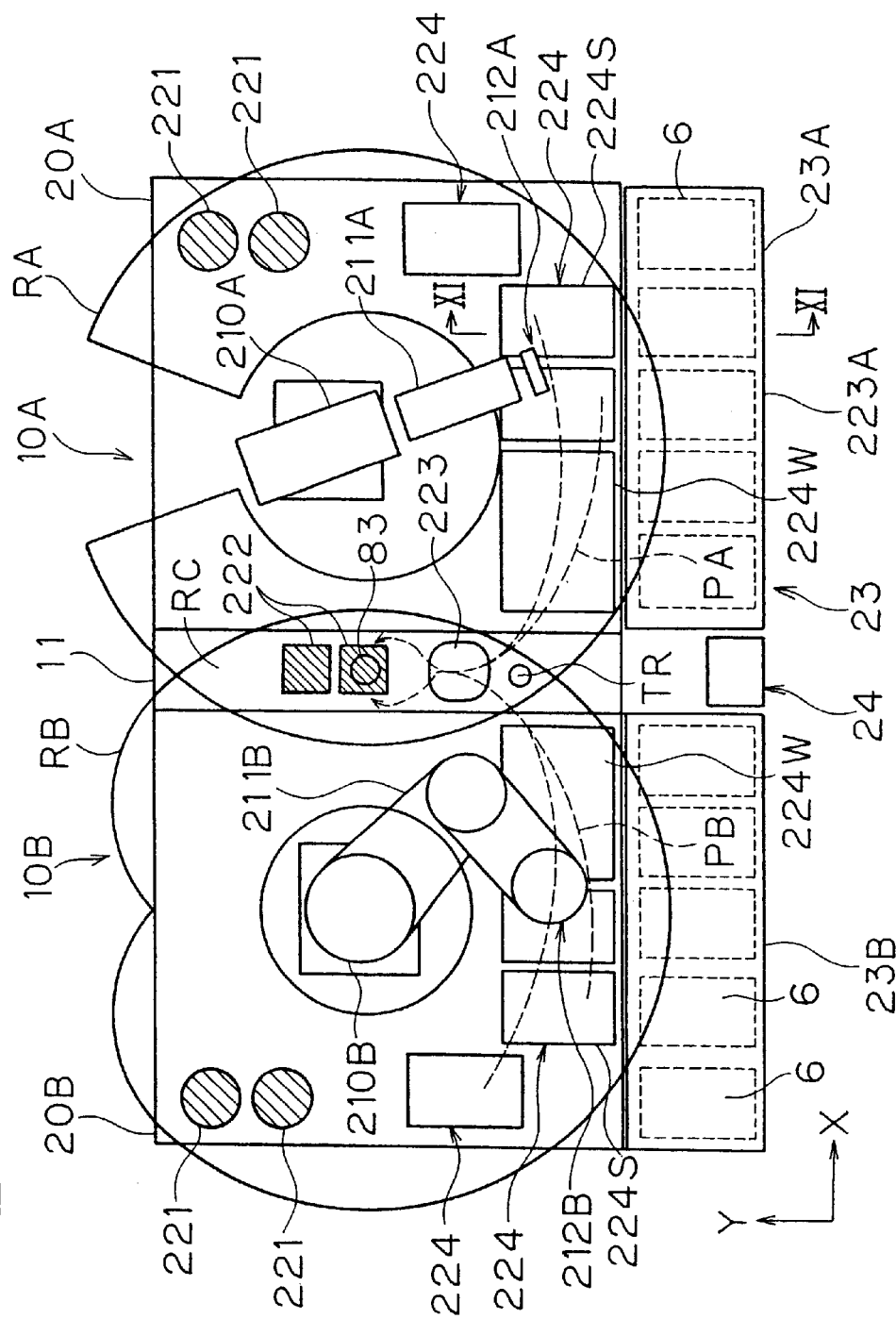
FIG. 2 is a plan view that shows an assembling device 2 seen from above.

FIG. 2 is a conceptual plan view that shows the assembling device 2 viewed from above. Referring to FIG. 1 and FIG. 2, the following description will be given.

The assembling device 2 is provided with a plurality of robot sections 10A and 10B, and an assembling workbench 11 is provided between the robot section 10A and 10B. Moreover, a supply section 23, placed adjacent to the robot sections 10A and 10B, for supplying parts, etc., an operation section 24 for carrying out input operations such as activating and stopping operations of the assembling device 2, and a control section 25 (see FIG. 1) for supervising and controlling the assembling device 2.

Schematic Structure of Robot Section and Assembling Workbench

One of the robot sections 10A is provided with a robot 210A fixed to virtually the center of the upper face of a base 20A, and the other robot section 10B is provided with a robot 210B fixed to virtually the center of the upper face of a base 20B. Each of these bases 20A and 20B has a rectangular flat face, and they are aligned face to face with a predetermined interval in between. An assembling workbench 1, which is a separated member, is closely located in the gap. The heights of the upper faces of the bases 20A, 20B and the assembling workbench 11 are set to be the same, and these faces form a virtually continuous one flat face that is defined as the reference face.

The robot 210A is a robot having six degrees of freedom in which an arm having three degrees of freedom in the pivotal movement is combined around the horizontal axis between two degrees of freedom in the rotational movement around the perpendicular axis, and as illustrated in FIG. 2, the work side end of a mechanical hand 211A corresponding to the tip of the arm thereof has a detachably attaching master section 212A to which a robot tool (which will be described later) is detachably attached.

Here, FIG. 2 shows a state in which the mechanical hand 211A of FIG. 1 is raised, and extended in the horizontal direction, and in FIGS. 1 and 2, the absolute ordinate system XYZ consisting of the horizontal XY directions and the vertical Z direction is defined.

The other robot 210B is a robot having four degrees of freedom in which one degree of freedom in the extension and contraction movements in the perpendicular direction is provided to the tip of an arm having three degrees of freedom in the rotational movement around the perpendicular direction, and as illustrated in FIG. 2, in the same manner as the robot 210A, the work side end of a mechanical hand 211B corresponding to the tip of the arm thereof has a detachably attaching master section 212B to which a robot tool is detachably attached.

As shown in FIG. 2 viewed in the horizontal direction, the tips of these robots 210A and 210B have respective movable ranges RA and RB. One of these movable ranges RA of the robot 210A has a virtually ring shape lacking one portion thereof, and the other movable range RB of the robot 210B has a virtually round shape with its one portion recessed.

Here, these movable ranges RA and RB are arranged so as to cover most of the portions of the upper face of the assembling workbench 11 except for the end portions. In particular, in the present preferred embodiment, these movable ranges RA and RB overlap each other on the assembling workbench 11 so that a common movable range RC is determined. This common movable range RC is determined as a space range in which the two robots 210A and 210B are operated in cooperation with each other. A jig holder 222 and a parts detector 223 (FIG. 2), which will be described later, are placed within the common movable range RC.

Here, in general, it is only necessary for the movable ranges RA and RB to be designed so as to have at least one overlapped portion on the upper face of the assembling workbench 11.

One robot 210A of the two robots 210A and 210B is allowed to pinch a part and to assemble the part in the horizontal direction as well as to assemble the part in the up and down directions. Moreover, the robot 210B is allowed to pinch a part and to assemble the part in the up and down directions. Therefore, for example, with respect to parts to be assembled in the horizontal direction, the robot 210B is used, and with respect to parts to be assembled in the horizontal direction, the robot 210A is used; thus, these are cooperatively operated with respectively different functions.

In the assembling system 1 of the present preferred embodiment, a supply section 23 is used for automatically bring parts required for assembling a predetermined assembly product, robot tools and assembling jigs into the movable ranges RA and RB from outside of the assembling device 2. Moreover, in addition to the assembly product completed through the automatic assembling job, unnecessary robot tools and assembling jigs for a new type of assembling job are automatically taken out of the movable ranges RA and RB to the outside of the assembling device 2 by the supply section 23.

This supply section 23 is placed along one side extending in the X direction of respective sides of each rectangular shape of the bases 20A and 20B as shown in the plan view, and provided as two supply sections 23A and 23B (FIG. 1) corresponding to the respective robot sections 20A and 20B that are linearly aligned.

Example of Robot Tool

Figure 4A:
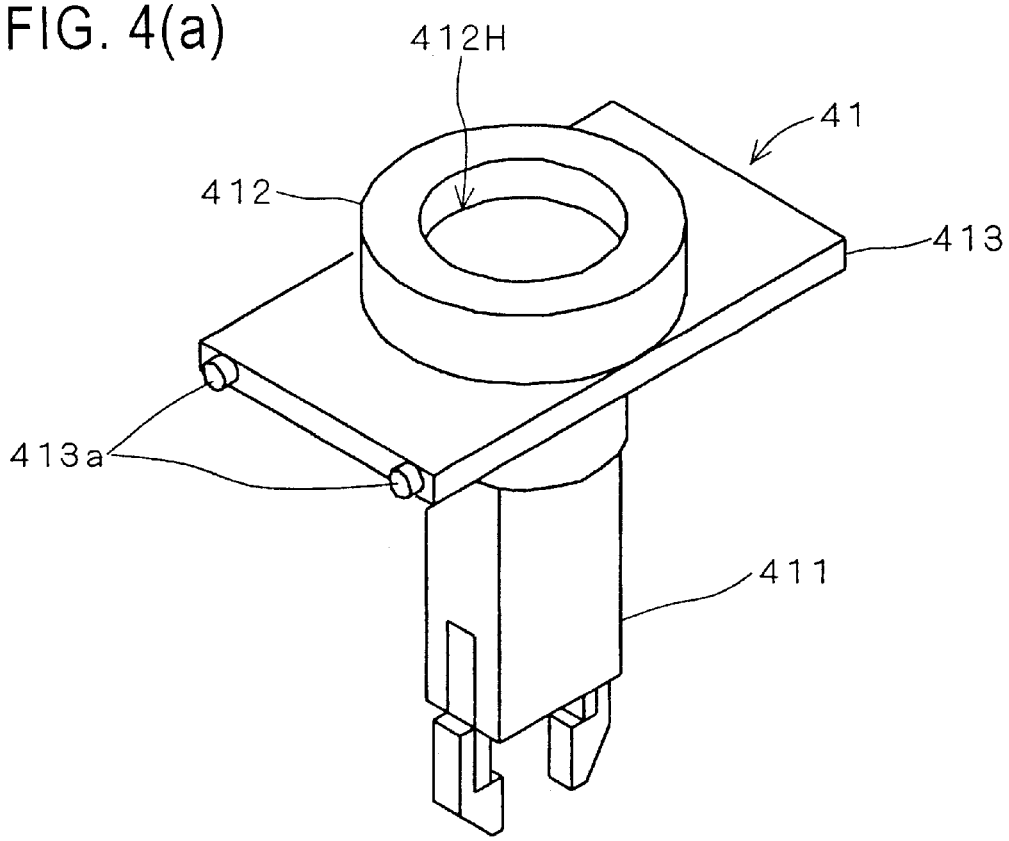
FIGS. 4(a) and 4(b) are perspective views that show an example of a robot tool.
Figure 4B:
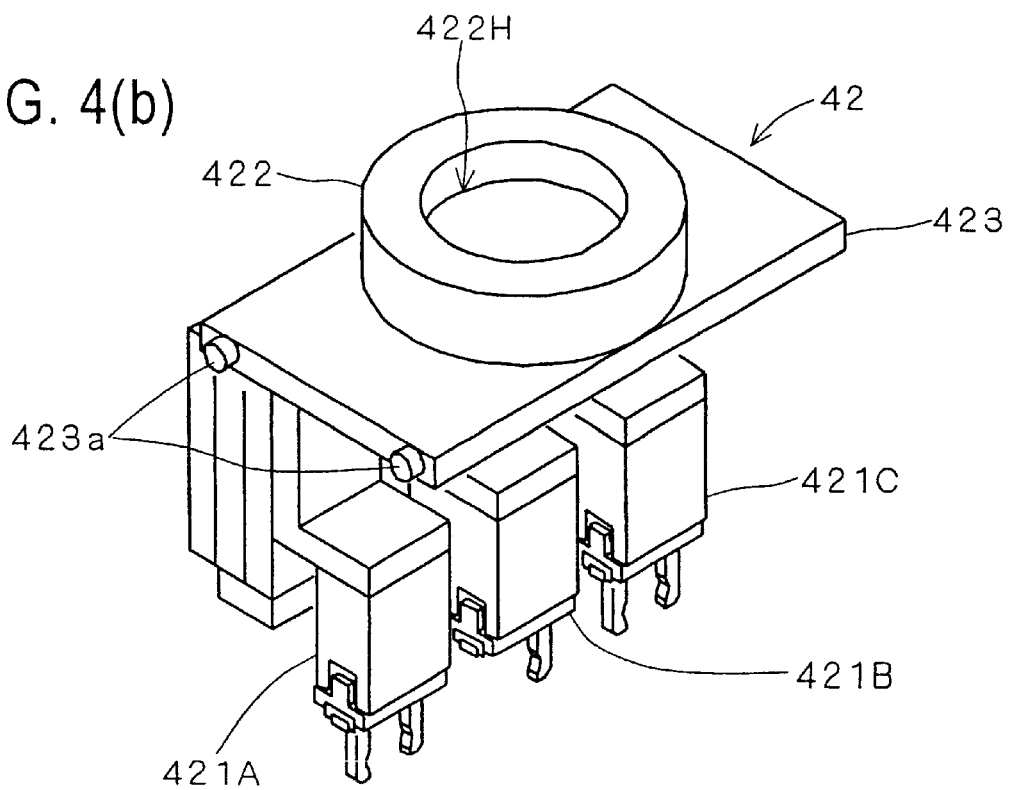

FIGS. 4(*a*) and 4(*b*) are perspective views that show an example of two types of robot tools. A robot tool 41 shown in FIG. 4(*a*) is provided with a chuck 411 that pinches a part, etc. and a connection section 412 that is detachably attached to the above-mentioned detachably attaching master section 212A, and the chuck 411 is attached to and supported by a plate-shaped support member 413 fixed onto this connection section 412. The connection section 412 has a short cylinder shape, and an attaching hole 412H is formed in the center thereof, and a plurality of convex portions 431*a* protrude from the side end of the support member 413.

A robot tool 42 shown in FIG. 4(*b*) is the same as the robot tool 41 of FIG. 4(*a*) in that it is provided with a connection section 422 having a detachably attaching hole 422H and a support member 423 from which a plurality of convex portions 423*a* protrude. However, in the case of the robot tool 42 of FIG. 4(*b*), a plurality of (three in the Figure) pinching mechanisms 421A, 421B and 421C having respectively different pinching mechanisms are fixed to an intermediate support member 421S in parallel with each other, with the intermediate support member 421S being fixed to the support plate 423 in parallel therewith.

Figure 5A:
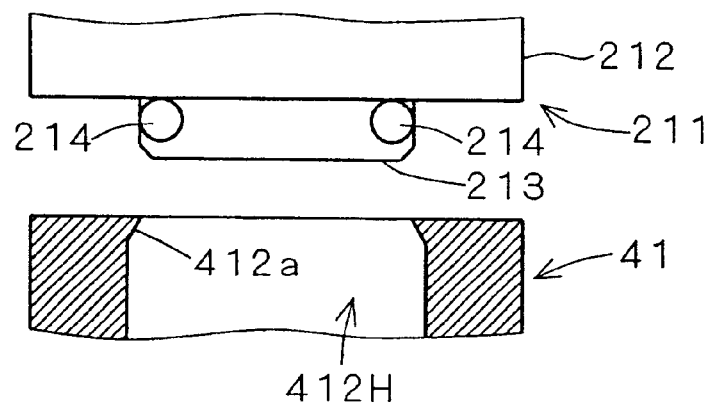
FIGS. 5(a) and 5(b) are explanatory drawings that show attaching and detaching operations of a mechanical hand 211 and a robot tool 41.
Figure 5B:
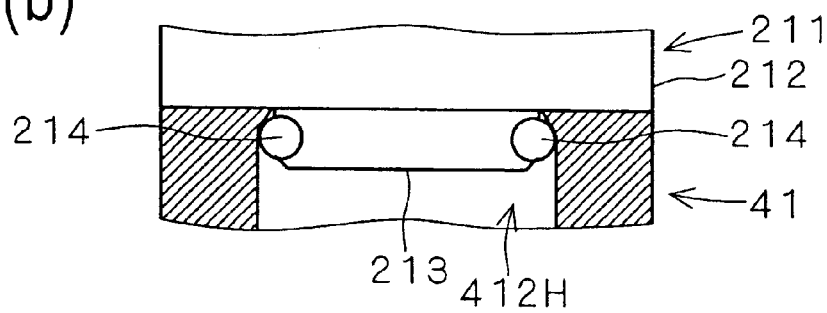

FIGS. 5(*a*) and 5(*b*) are drawings that explain the attaching and detaching operations between mechanical hands 211 (211A, 211B) and the robot tool 41. FIG. 5(*a*) shows a state in which a robot tool 41 is not connected to the mechanical hand 211, and FIG. 5(*b*) shows a state in which it is connected thereto. The mechanical hand 211A of the robot 210A and the mechanical hand 211B of the robot 210B are attached to the robots having different degrees of freedom; however, their connecting structures between the detachably attaching master sections 212A and 212B and the robot tools are the same. For this reason, in FIGS. 5(*a*) and 5(*b*), the mechanical hand 211A of the robot 210A and the mechanical hand 211B of the robot 210B are indicated by the same reference number 211. Moreover, the robot tool 41 of FIG. 4(*a*) and the robot tool 42 of FIG. 4(*b*) have respectively different pinching mechanisms; however, they have the connection sections 412 and 422 having the same structure so that explanations given of the robot tool 41 in FIGS. 4(*a*)

and 4(*b*) are also applied to the robot tool 42. Furthermore, with respect to robot tools of other types, not shown, their connection sections are designed to have the same structure as the connection section 412, 422 of the robot tools 41, 42; therefore, the connection principle as described below is also applied to those robot tools.

The detachably attaching master section 212 of the tip of the mechanical hand 211 is provided with a protruding portion 213 having a short cylinder shape protruding along the center axis thereof, and round holes are formed in a plurality of portions on the side face of the protruding portion 213, and in each of the round holes, a movable ball 214 having a diameter slightly larger than that of the round hole is housed. Air pressure (compressed air) is supplied to the inside of the cylindrical protruding portion 213 through an arm of the mechanical hand 211 so that the ON/OFF operations of the compressed air supply allows the movable ball 214 to advance in and retreat from the side face of the cylindrical protruding section 213.

On the other hand, the attaching hole 412H formed in the connection section 412 of the tool detachably attaching section 412 has a slanting face 412*a* having a reversely tapered shape having a narrowed portion in the vicinity of the outlet, and the diameter of the opening is allowed to fit to the outer diameter of the protruding portion 213 on the mechanical hand 211 side.

Here, in an uncoupled state shown in FIG. 5(*a*), the movable ball 214 is housed inside the protruding section 213. However, in a coupled state shown in FIG. 5(*b*), the movable ball 214 is moved by the compressed air supply, and one portion of the movable ball 214 is allowed to protrude outside the protruding portion 213 so that the movable ball 214 is engaged with the slanting portion 412*a* of the attaching hole 412H. In this manner, the mechanical hand 211 and the robot tool 41 are coupled to each other. The above-mentioned operation makes it possible to exchange robot tools required for an assembling job. When the supply of the air pressure is stopped, the pressing force applied to the movable ball 214 disappears, and the mechanical hand 211 is drawn from the robot tool 41 so that the robot tool 41 is disengaged by its own gravity.

Figure 6:
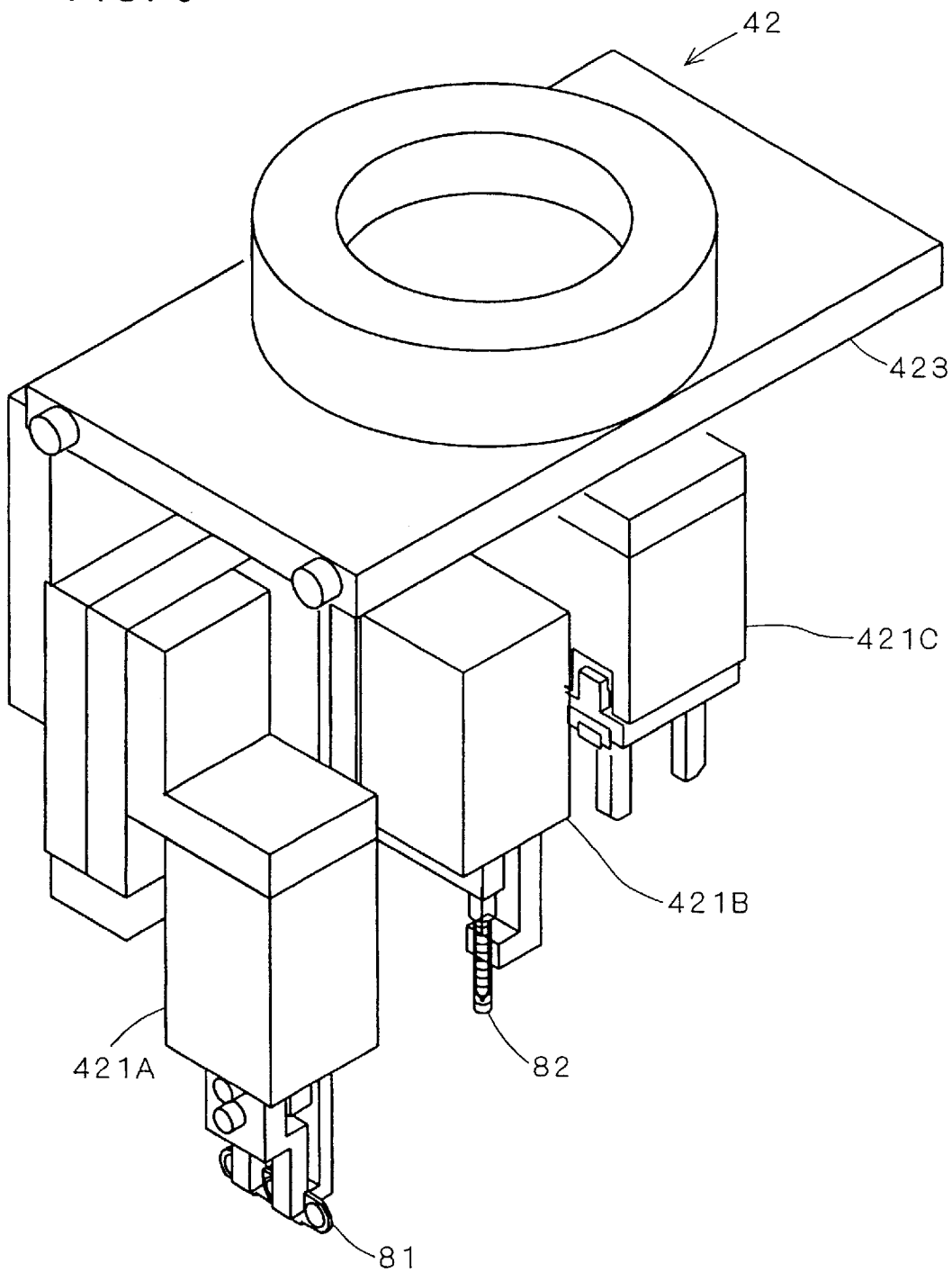
FIG. 6 is a drawing that shows a state in which a robot tool 42 is holding a part.

FIG. 6 is a drawing that shows a state in which the robot tool 42, coupled to the mechanical hand 211, pinches a part. As illustrated in FIG. 6, it is allowed to pinch a plate-shaped part 81 at the tip of the chuck 421A while holding a cylindrical coil-shaped part 82 at the tip of the chuck 421B.

Layout of Members Placed on the Base and Work Bench

As illustrated in FIGS. 1 and 2, on the upper face of each of the bases 20A and 20B, a plurality of tool holders 221 for holding a plurality of robot tools including the robot tools 41 and 42, and a positioning plate 224 for positioning a tray 6, which will be described later are placed.

Figure 7:
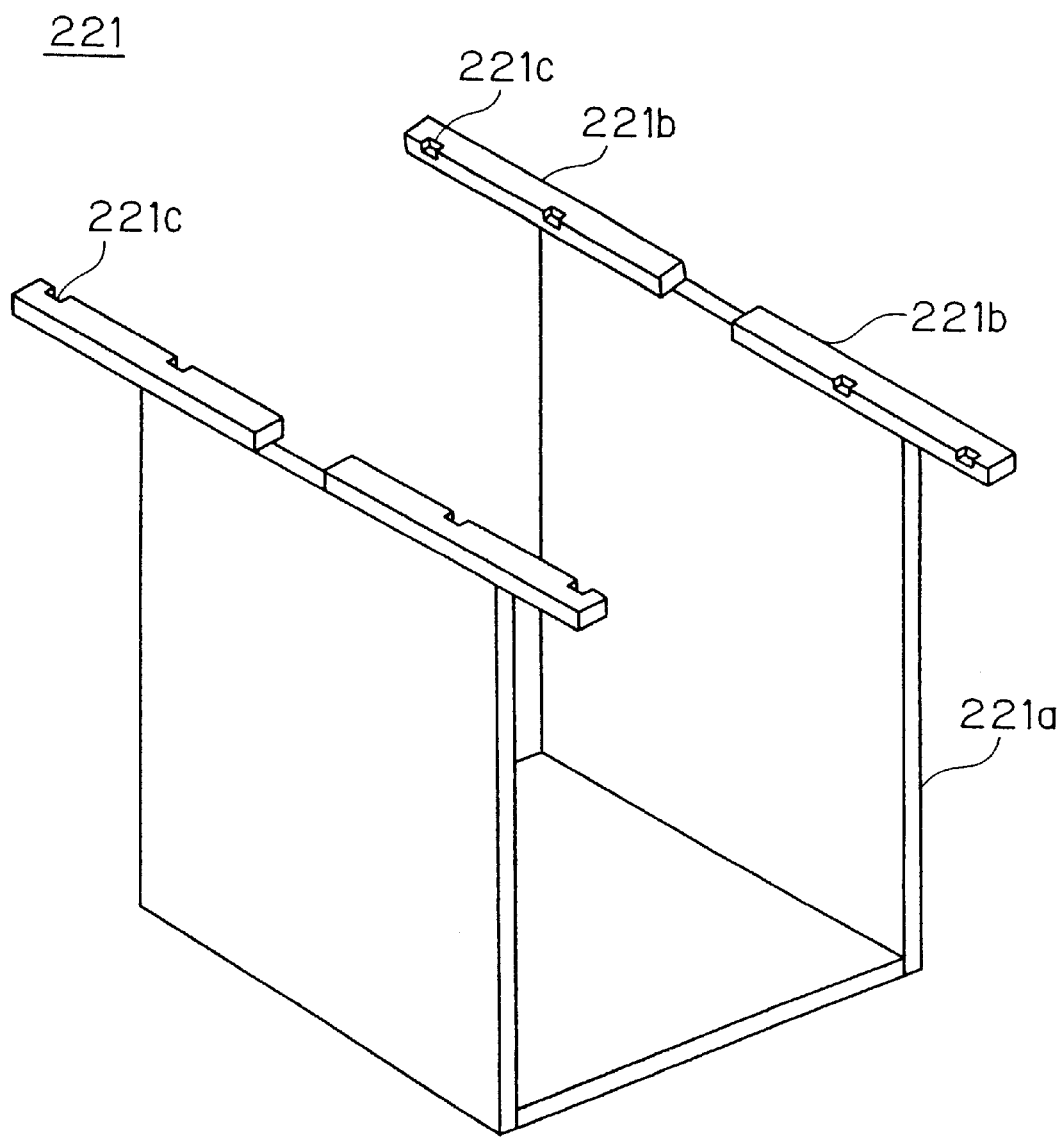
FIG. 7 is a perspective view that shows a tool holder 221.

FIG. 7 is a perspective view that shows a tool holder 221.

The tool holder 221 is constituted by a holder main body 221*a* formed as a bent plate having a square shape with one side being removed, and four rod-shaped tool placing sections 221*b* attached to the tip of the holder main body 221*a*. Two concave sections 221*c* are formed on the upper face of each tool placing section 221*b*.

Here, a convex section 413*a* (423*a*) of the robot tool is engaged by a concave section 221*c* of the tool holder 221 so that the robot tool is maintained in a suspended state. Simultaneously, the robot tool is positioned with respect to the tool holder 221.

As illustrated in FIG. 2, a plurality of positioning plates 224 are used for positioning trays 6 on the bases 20A and 20B, and constituted by positioning plates 224s of a single size having a predetermined unit width in the horizontal direction X and positioning plates 224w of a double size having a width twice the unit width, and these two types of plates are placed in a mixed manner.

The assembling workbench 11, which is a rectangular shape as shown in the plan view, has a length in the depth direction (Y direction) that is conformed to the length of the bases 20A, 20B in the Y direction. For this reason, when the bases 20A and 20B are arranged in a manner so as to sandwich the workbench 11, these members, as a whole, form a rectangular shape as shown in the plan view. This arrangement makes it possible to improve the degree of freedom in the layout when many more robot sections and work benches are added, as will be described later, and also to prevent wasteful use of space.

As illustrated in FIG. 2, a plurality of jig holders 222 for holding assembling jigs which will be described later, are placed on the upper face of the workbench 11, and a part detector 223, which, while each of chucks attached to the respective robots 10A and 10B at the corresponding stages of the job is allowed to pinch a part so as to transport it, detects whether or not the chuck in question actually pinches a chuck as illustrated in FIG. 6 in a non-contact state, is also installed thereon.

Figure 8A:
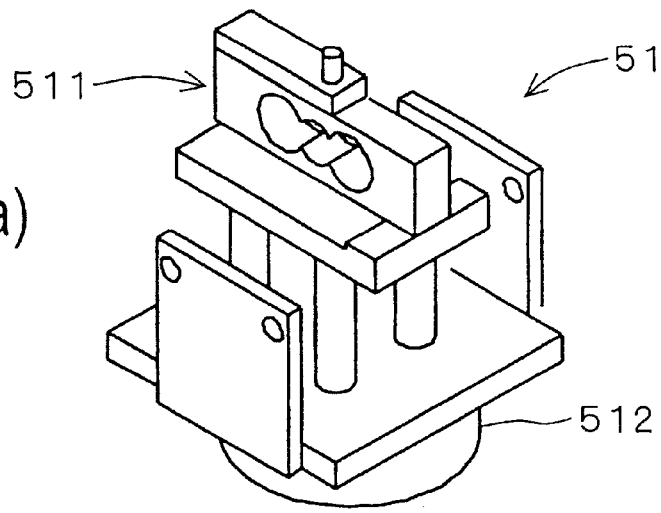
FIGS. 8(a) and 8(b) are perspective views that shows an assembling jig.
Figure 8B:
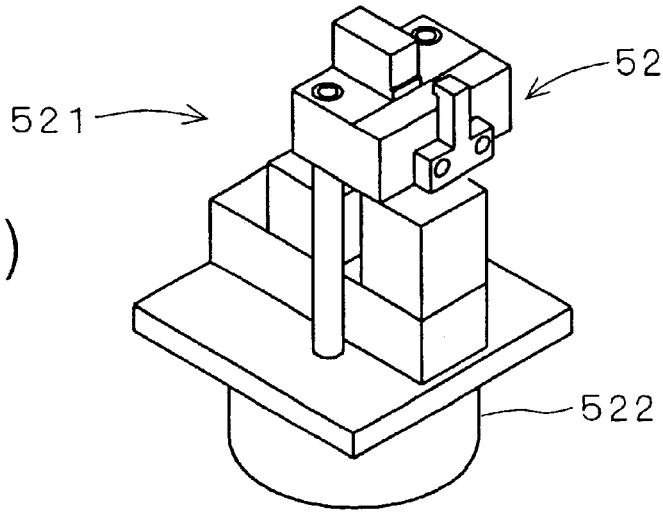
Figure 8C:
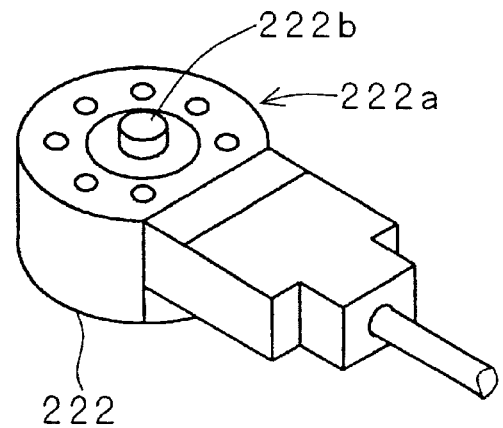
FIG. 8(c) is a perspective view that shows a jig holder 222.

FIGS. 8(a) and 8(b) are perspective views that show examples of assembling jigs, and FIG. 8(c) is a perspective view that shows an example of a jig holder 222. A assembling jig 51, shown in FIG. 8(a) is provided with a part holding section 511 for holding a part, etc., and a holder connecting section 512 that is freely removably connected to the jig holder 222. A assembling jig 52, shown in FIG. 8(b) is also provided with a part holding section 521 for holding a part, etc., and a holder connecting section 522 that is freely removably connected to the jig holder 222. Moreover, the jig holder 222 shown in FIG. 8(c) has its bottom face fixed to the upper face of the workbench 11, and is provided with a jig mounting section 222a on which the assembling jig 52 is mounted. The jig mounting section 222a has a protruding portion 222b, and this protruding portion 222b is fitted to a hole (not shown) formed in the bottom face of each of the holder connecting sections 512 and 522 so that the assembling jig 52 is maintained and the assembling jig 52 is positioned with respect to the jig holder 222.

Figure 9:
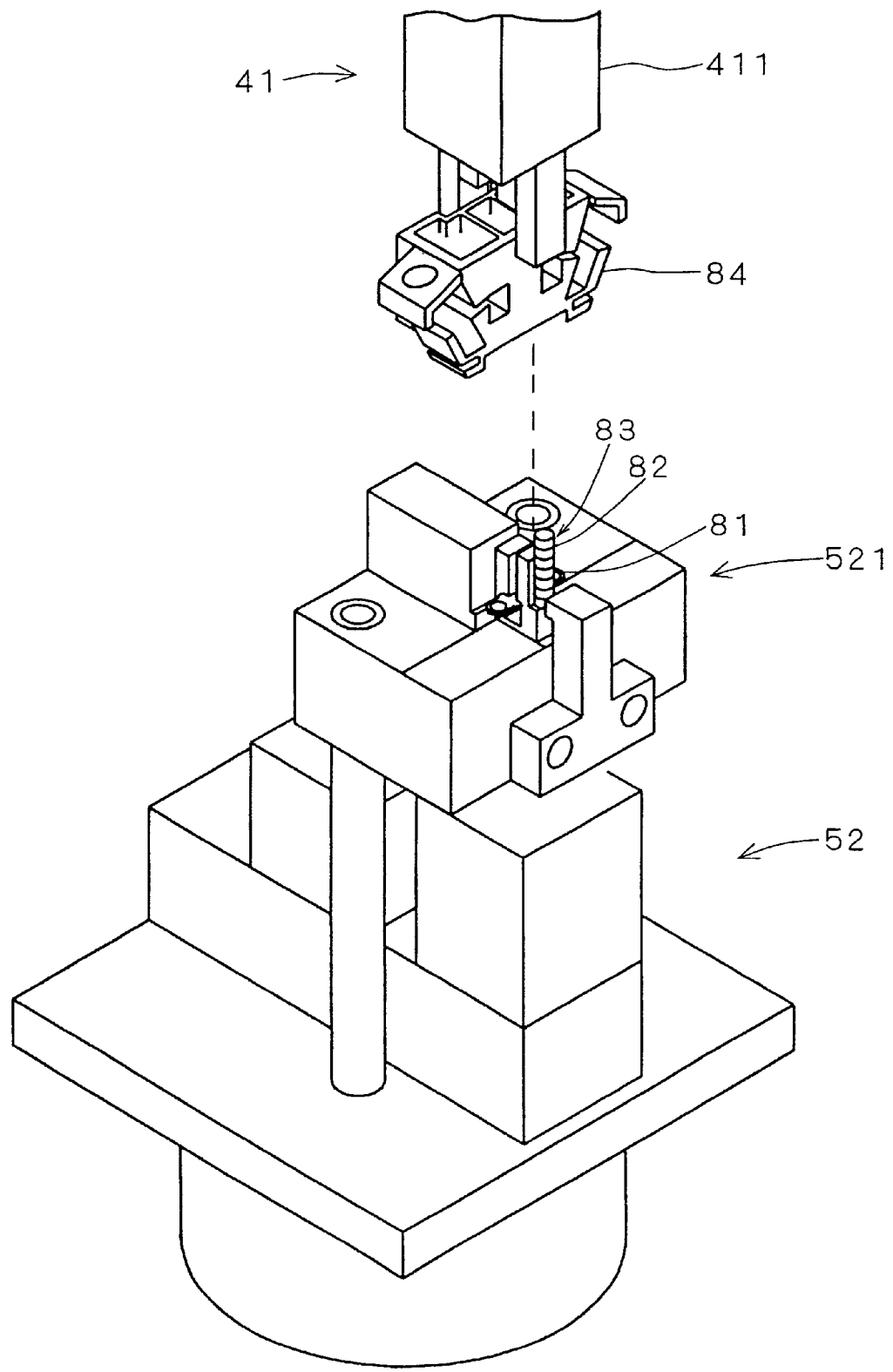
FIG. 9 is a drawing that shows a state in which parts are being assembled.

FIG. 9 is a drawing that shows a state in which parts are assembled by using the above-mentioned assembling jig 52. On the parts holding section 521 of the assembling jig 52, parts to be assembled 81 a that are in the middle of an assembling process for an assembly product are placed. These parts to be assembled 83 include the plate-shaped part 81 and the cylindrical coil-shaped member 82, etc. that are assembled to predetermined positions. Then, in FIGS. 5(a) and 5(b), a part 84 held by the chuck 411 of the robot tool 41 is lowered from above to the assembling jig 52, which shows one stage in the assembling process of these parts.

Figure 10:
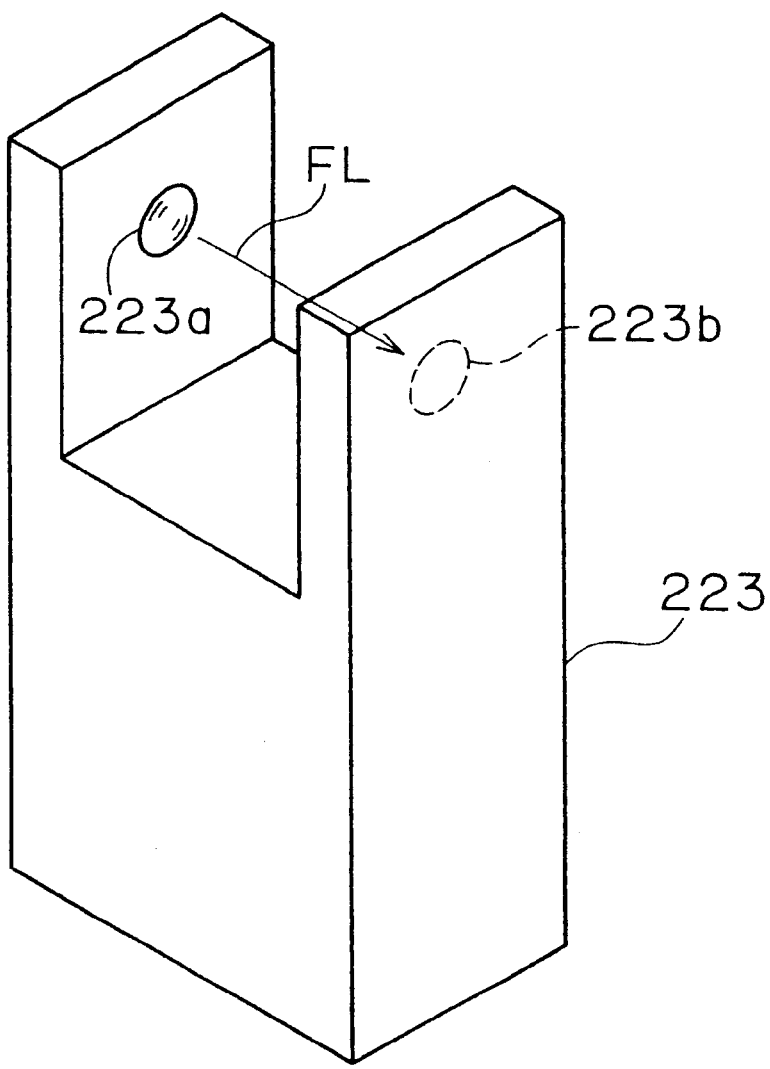
FIG. 10 is a perspective view that shows a parts detector 223.

FIG. 10 is a perspective view that shows a part detector 223. The part detector 223 is a U-letter shaped member having a light-emitting section 223a and a light-receiving section 223b. A part pinched by the robot tool is shifted by the mechanical hand in a manner so as to cross light FL emitted from the light-emitting section 223a. Here, when any part is pinched by the robot, the light FL is blocked, and the light-receiving section 223b is not allowed to detect the light FL. In contrast, if the robot tool has failed to pinch the part, the light FL is not blocked, thereby allowing the light-receiving section 223b to detect the light FL. In this manner, by monitoring the light FL by using the light-receiving section 223b, it is possible to detect the holding state of the part by the robot tool.

Here, the part detector 223 is placed within the common movable range RC of the respective robots 210A and 210B shown in FIG. 2 or in the vicinity thereof; therefore, with respect to the robots 210A and 210B, the corresponding robot tool is allowed to successively pinch a part in a tray that is currently being used (hereinafter, referred to as "tray in use") as a taking-out target of the part and is placed on the positioning plate 224, and to bring it to the position of a product being assembled 83 (that is, the installation position of the assembling jig 51 and the jig holder 222) through a transport path, and at this time, it becomes possible to detect whether or not any part is being pinched by the corresponding robot tool in the transport path.

In other words, with respect to the robots 210A and 210B, each of transport paths in a single direction, through which the robot tool pinches a part in the tray in use and picks it up, and is allowed to shift toward the product being assembled 83 with its pinching state being maintained, is set so as to pass through a predetermined position within the common movable range RC. Then, the part detector 223 is placed in the predetermined position or in the vicinity thereof; thus, as compared with, for example, a case in which the part detector 223 is placed in the vicinity of the tool holder 221 shown in FIG. 2 for each of the robots independently, it becomes possible to detect the holding state of a part by the robot by using a smaller number of part detectors (in this example, one part detector 223).

Moreover, in the above-mentioned comparative example, reciprocal operations (reversing operations) are required in which: the robot 210A is rotated counterclockwise from the tray in use to the position of the part detector, and the detection is made as to the holding state of the part; and thereafter, the robot needs to be rotated clockwise reversely to transport the part to the position of the product being assembled 83 (the position above the jig holder 222). In contrast, in the arrangement of the present preferred embodiment wherein the part detector 223 is placed in each of transport paths for parts in a single direction (in the example of the robot 210A of FIG. 2, a transport path PA in a single direction from the tray in use to the product being assembled 83 clockwise); thus, it becomes possible to eliminate the reciprocal operations of the robot, thereby contributing to the assembling tact. In the case of the robot 210B, a transport path PB in a single direction from the tray in use to the part detector 223 counterclockwise corresponds to the "single-direction part-transport path".

In this case, although the starting points are different depending on which tray in use provides the part, since a plurality of trays in use are placed on a plurality of positioning plates 224, the respective part transport paths PA and PB are joined to the same path in their stages passing through the part detector 223, as illustrated in FIG. 2. When, after having passed through the part detector 223, the paths come close to the product being assembled 83, they separate to their own paths depending on directions from which the parts are attached to the product being assembled 83.

In the case when the part detector 223 has made a judgment that the robot 210A or 210B has no part, the corresponding robot returns to the part tray and newly picks up the part. Thus, the error in holding one part does not necessarily cause all the assembling job to stop.

Moreover, in the case when the part detector 223 has made a judgment that the robot 210A or 210B has no part, as illustrated in FIG. 2, the chuck of the corresponding robot is shifted to a trash box TR placed within the common movable range RC, and the chuck is opened above the trash box TR.

Then, even if, for example, the part is tilted or offset and held within the chuck of the robot 210A or 210B with the result that the holding state of the part is not detected, such a part in the erroneously held state can be recovered through the trash box TR.

With this arrangement, it becomes possible to eliminate the following problem in which: even though the part is being held, a judgment is erroneously made that "no part is held", and the corresponding robot returns to the part tray with the part being held, and releases the original part onto the part tray in an attempt to pinch a new part, resulting in interference in picking up a new part thereafter.

This trash box TR may be provided as a shiftable member so that the robot 210A or 210B may finally shift this automatically outside the device; thus, no human hands are required in recovering the trash box TR.

Here, in FIG. 10, the example of the light-transmission type for detecting the blocked light FL is given; however, not limited to this, a reflection type detector in which a part is detected by applying light onto a detection object (part) and monitoring the reflected light therefrom may be used. Moreover, the presence or absence of a held part may be detected by image processing using a camera.

Constitution of Supply Section 23

Figure 11A:
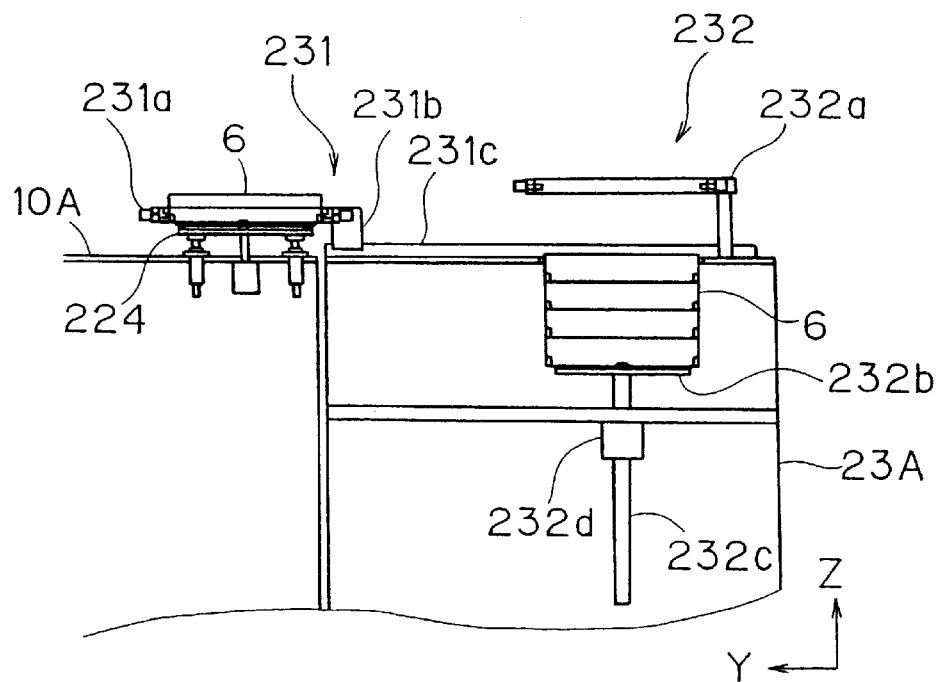
FIGS. 11(a) and 11(b) are cross-sectional views taken along line XI—XI of FIG. 2.

A supply section 23 of FIG. 2 is provided with: a tray transport section 231 (FIG. 11(a)) for transporting a tray 6 on which parts, etc. are placed, a tray exchange section 232 (also shown in FIG. 11(a)) for exchanging trays to be transported and a tray discrimination section 233 (FIG. 12) for discriminating the tray.

FIG. 11(a) is a cross-sectional view taken along line XI—XI of FIG. 2.

The tray transport section 231 is provided with a tray holding section 231a for reciprocally shifting in the horizontal direction Y while maintaining the tray 6, and a driving section 231b, connected to the tray holding section 231b, for applying a reciprocal driving force to the tray in the horizontal direction Y. The tray holding section 231a has a function for holding the tray 6 as well as a function for releasing it from the holding state. The tray holding section 231a includes a first tray holding section 231a-1 (FIG. 1) for holding trays of a single size having a width corresponding to the positioning plate 224s and a second tray holding section 231a-2 for holding trays of a double size having a width twice the width of the positioning plate 224s. Moreover, the driving section 231b, shown in FIG. 11(a), is allowed to shift along a rail 231c through an air-driving operation. When the tray, held by the tray holding section 231a, is transported right above the positioning plate 224 for positioning the tray above the base 20A, the holding state of the holding section 231a is released so that a positioning block 224b (FIG. 13(a)) of the positioning plate 224 and a positioning groove 61 (FIG. 13(a)) of the tray 6 are fitted to each other; thus, the position of the tray 6 is determined with respect to the robot 210A.

The tray exchange section 232 is provided with a tray holding section 232a having the same construction as the tray holding section 231a and a support plate 232b for supporting stacked trays 6 from below. Moreover, a support plate 232c the upper end of which is connected to the support plate 232b and a raising and lowering motor 232d for raising and lowering the support plate 232c are also installed.

Upon exchanging a tray carrying no parts or a tray filled with assembly products that have been completed (hereinafter, referred to as "used tray") with another tray (hereinafter, referred to as "tray to be used next"), the following operations are carried out.

Figure 11B:
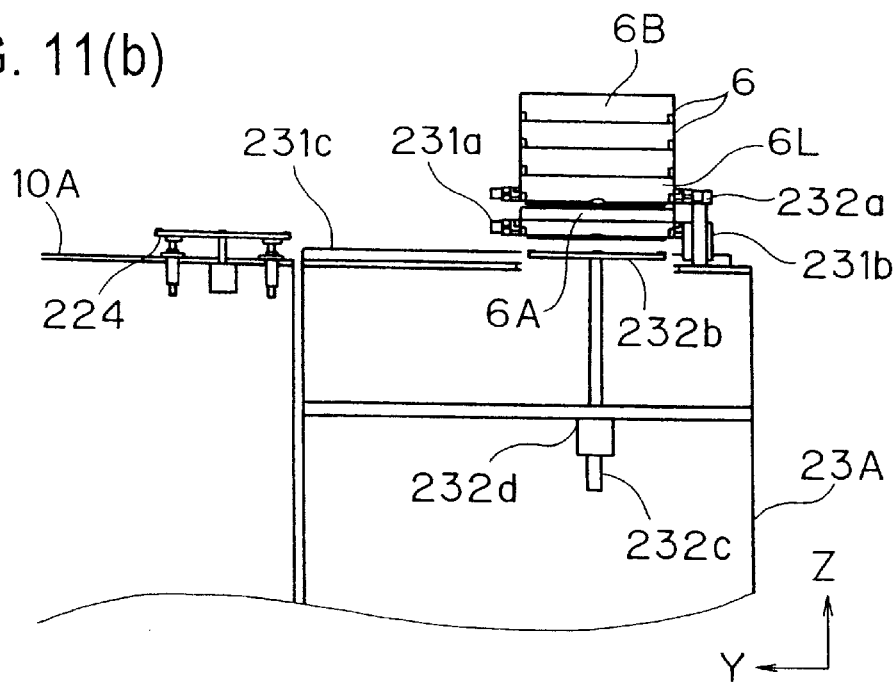

(1) The raising and lowering motor 232d is operated so that the group of trays stacked on the support plate 232b is raised, and the tray 6L on the lowermost stage is held by the tray support section 232a (see FIG. 11(b)).

(2) A used tray 6A is shifted right above the support plate 232b by the operation of the driving section 231b (see FIG. 11(b)).

(3) The tray holding sections 231a and 232a are released from their holding states so that a total tray is placed on the support plate 232b. Then, the raising and lowering motor 232d is operated so that the total tray is lowered, and a tray 6B to be used next on the uppermost stage is held by the tray support section 231a, and is shifted to the positioning plate 224A (see FIG. 11(a)).

The above-mentioned operation makes it possible to exchange trays.

Figure 12:
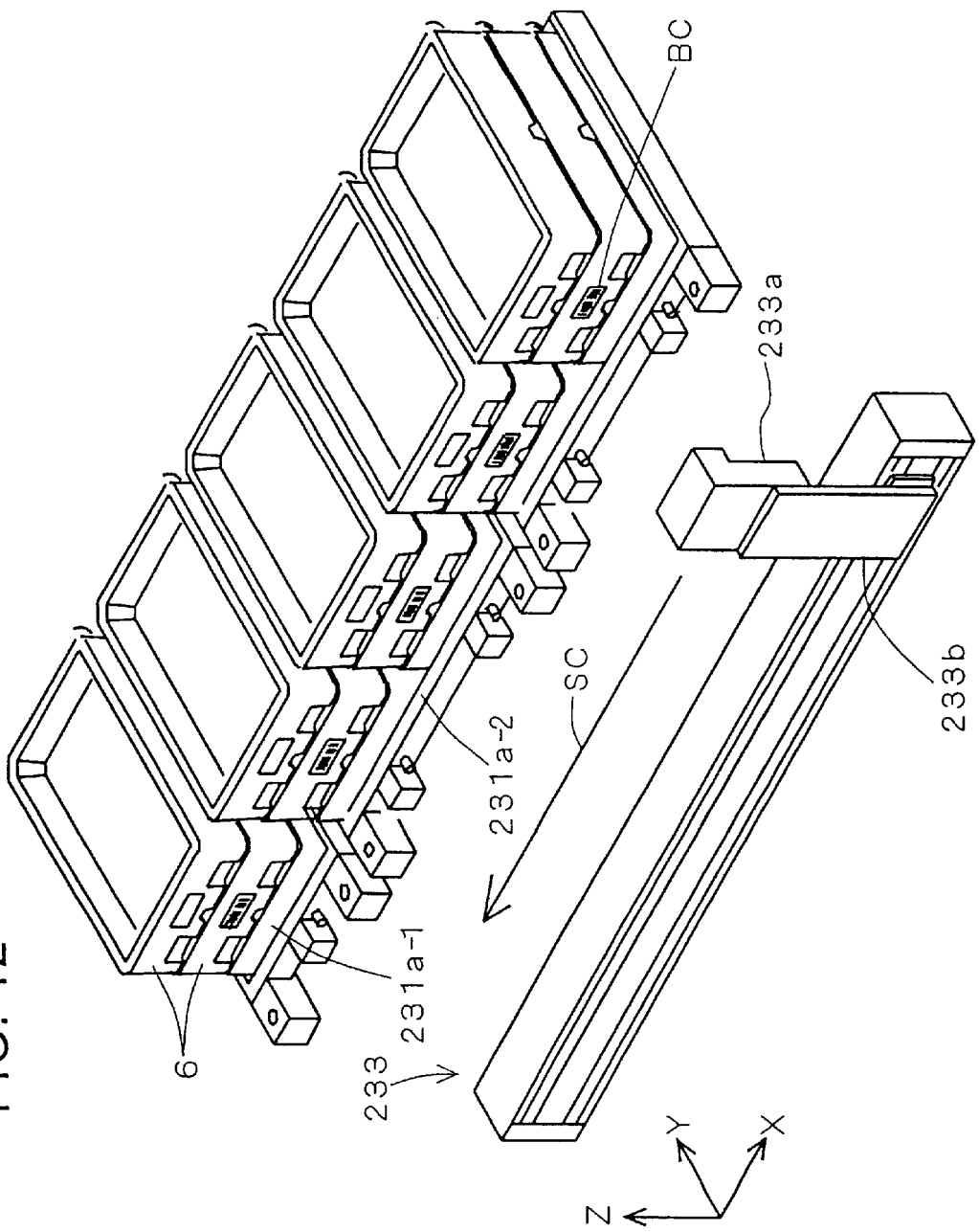
FIG. 12 is an explanatory drawing that shows the operation of a tray recognition section 233.

FIG. 12 is a drawing that explains the operation of the tray discrimination section 233.

The tray discrimination section 233 is provided with a scanner 233a having a bar-code reading section, and a scanner shifting section 233b for reciprocally shifting the scanner 233a in the horizontal direction X. The scanner 233a detects a sign (bar-code) BC put on the outer surface of the tray 6 so that it discriminates the type of a housed object such as a part placed on each tray 6. In other words, onto the end face of each tray 6 is put a bar-code BC that is preliminarily assigned for each of the types of housed objects placed on the corresponding tray 6, and in accordance with the bar-code BC, it is possible to discriminate the housed object held by the tray. Thus, it is possible to positively transport the tray housing the object to be transported. Moreover, discrimination of a plurality of trays 6 is carried out once by driving the scanner driving section 232b so as to shift the scanner 233a in the direction of arrow SC.

Here, upon discriminating the housed object of any tray on another stage in the tray stacked body, the tray stacked body is raised or lowered by the support plate 232b shown in FIG. 11(a) and FIG. 11(b), and with the bar-code BC on the corresponding stage being located in the same level as the reading head of the scanner 233a, the scanning is carried out.

A list of parts, etc. required for an assembling process to be executed is preliminarily registered in the control section together with their bar-codes, and when the code number of the bar-code BC, read by the scanner 232a, is coincident with the corresponding registered code, a judgement is made that no error exists with respect to the placement of the tray 6, the sequence of the assembling process is continued. In contrast, if the code number of the bar-code BC is not coincident with the registered code, a judgment is made that there is an error on the placement of the tray 6, the assembling process is suspended, and a warning sound, etc. is generated so as to inform the operator of the misplacement of the tray.

The following description will discuss the tray 6.

Figure 13A:
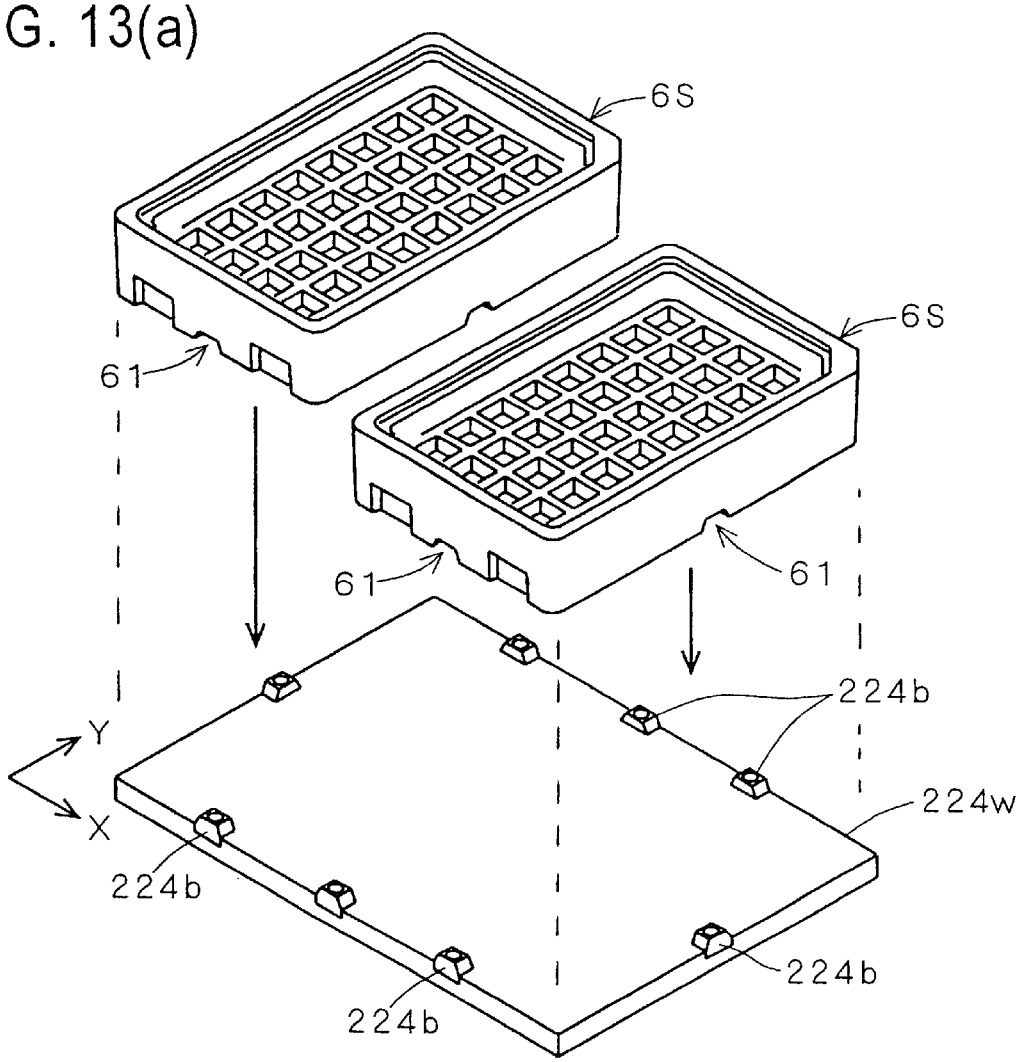
FIGS. 13(a) and 13(b) are drawings that explain a positioning operation of a tray 6s.
Figure 13B:
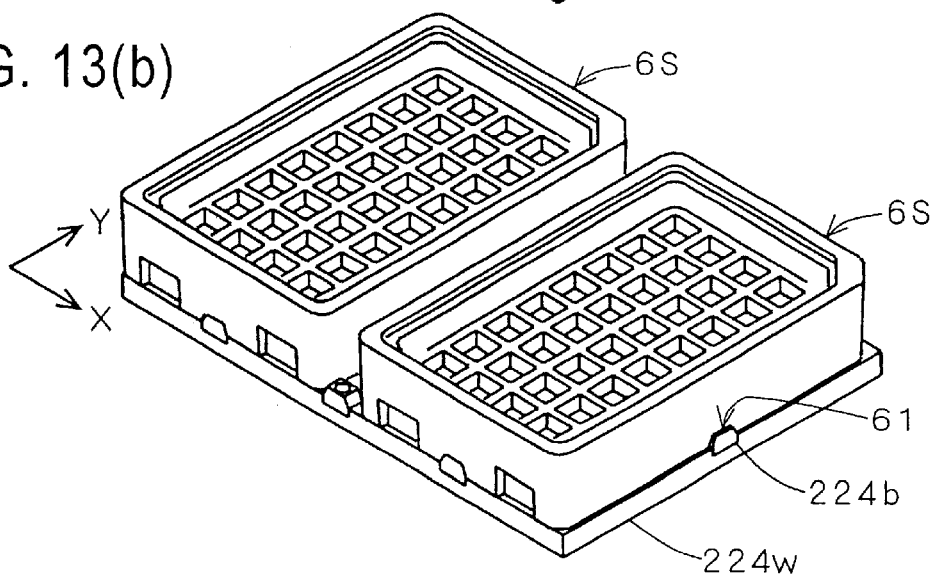

FIGS. 13(a) and 13(b) are drawings that explain a state in which a tray 6s of the single size having a predetermined unit width in the direction of X in FIG. 1 is positioned with respect to the positioning plate 224w of the double size.

The tray 6s, which corresponds to the positioning plate 224s of the single size, has a plurality of positioning grooves 61 as a first local shape along edge sides of the bottom section. Moreover, the positioning plate 224w of the double size has eight positioning blocks 224b that stick out along the outer circumference thereof as a second local shape that corresponds to the first local shape. Here, as illustrated in FIG. 13(a), two trays 6s are arranged on the positioning plate 224w of the double size, and the corresponding positioning grooves 61 and the positioning blocks 224b are fitted to each other so that the positioning process as shown in FIG. 13(b) is carried out.

Here, not shown in FIGS. 13(a) and 13(b), with respect to the positioning plate 224s (FIG. 2) of the single size, total four positioning blocks 224b, two for each of longitudinal and lateral directions, are formed in a manner so as to stick out; thus, only one tray 6s of the single size can be placed in a positioned state.

Figure 14:
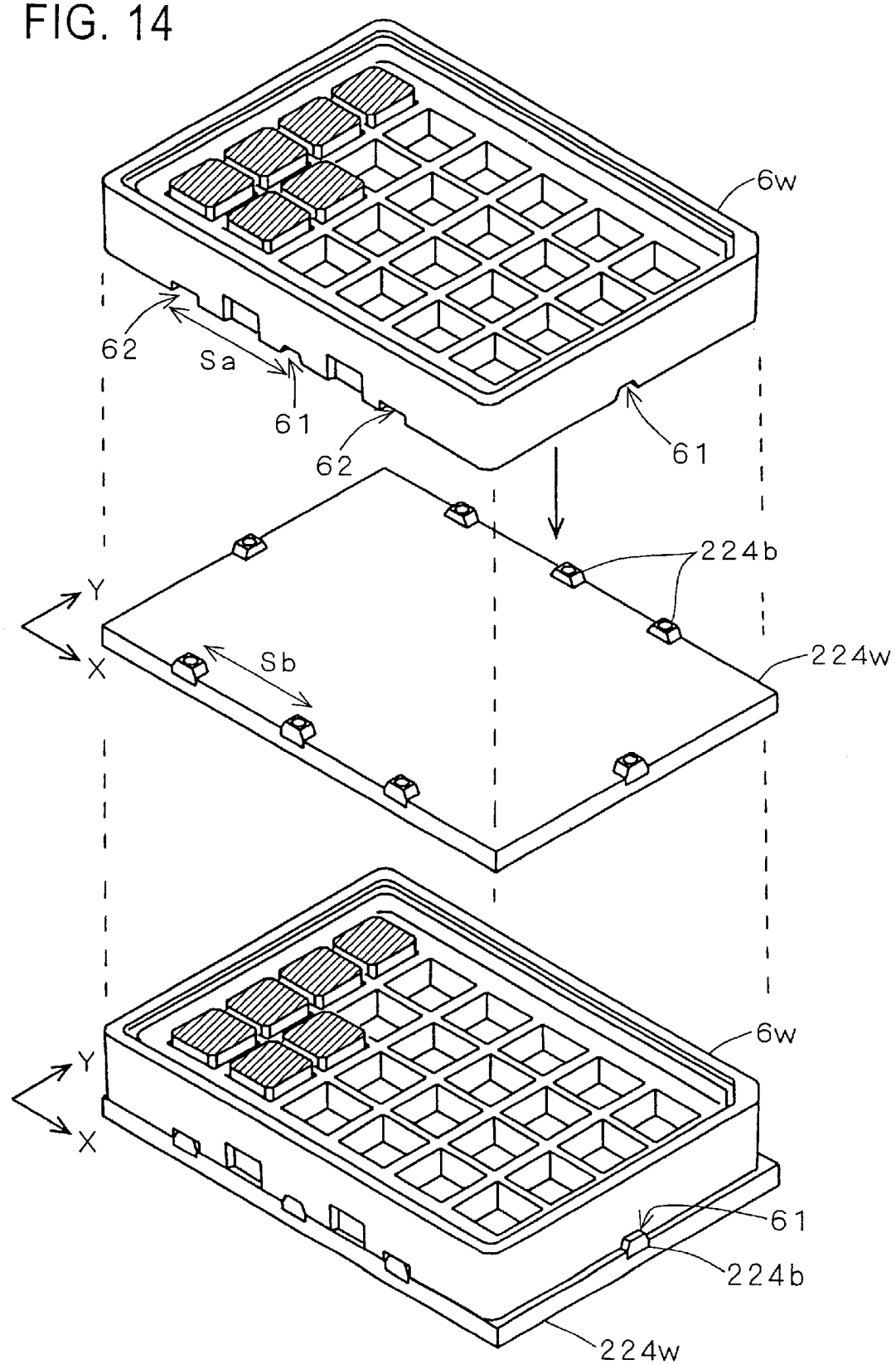
FIG. 14 is an explanatory drawing that shows the positioning operation of a tray 6w.

FIG. 14 is a drawing that explains a state in which a tray 6w of the double size having a width two times the unit width is positioned with respect to the positioning plate 224w of the double size.

The tray 6w, shown in FIG. 14(a), which has the same size as the positioning plate 224w in terms of the flat face, is provided with a plurality of positioning grooves 61, and a plurality of positioning block escape grooves 62, each having a groove width slightly greater than the positioning block 224b. The positioning block escape grooves 62 are provided so that, in the case when the gap Sa between the grooves of the tray 6w and the mutual gap Sb of the blocks 224b of the positioning plate 224w come to fail to coincide with each other due to thermal contraction, etc. of the tray 6w, they prevent all the positioning blocks 224b from failing to fit appropriately. Therefore, the positioning grooves 61 that relate to the positioning process are placed at positions passing through the center axis with respect to the two directions of X and Y of the tray 6w, and the rest of the grooves are provided as the positioning block escape grooves 62. With this arrangement, in the same manner as the positioning of the tray 6s, the mutually corresponding positioning grooves 61 and the positioning blocks 224b are fitted to each other so that the positioning as illustrated in FIG. 14(b) is carried out.

Figure 15A:
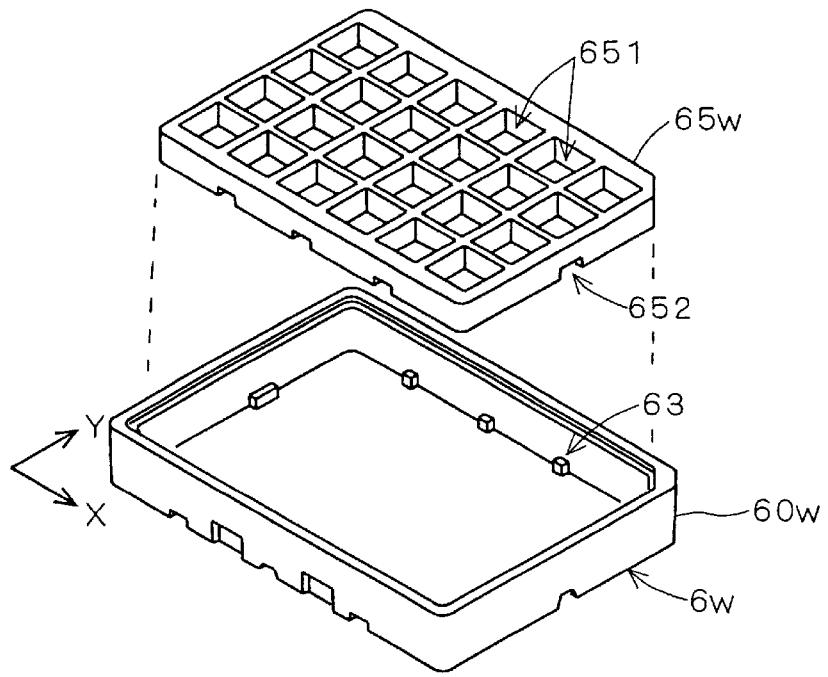
FIGS. 15(a) and 15(b) are drawings that show the structure of a tray.
Figure 15B:
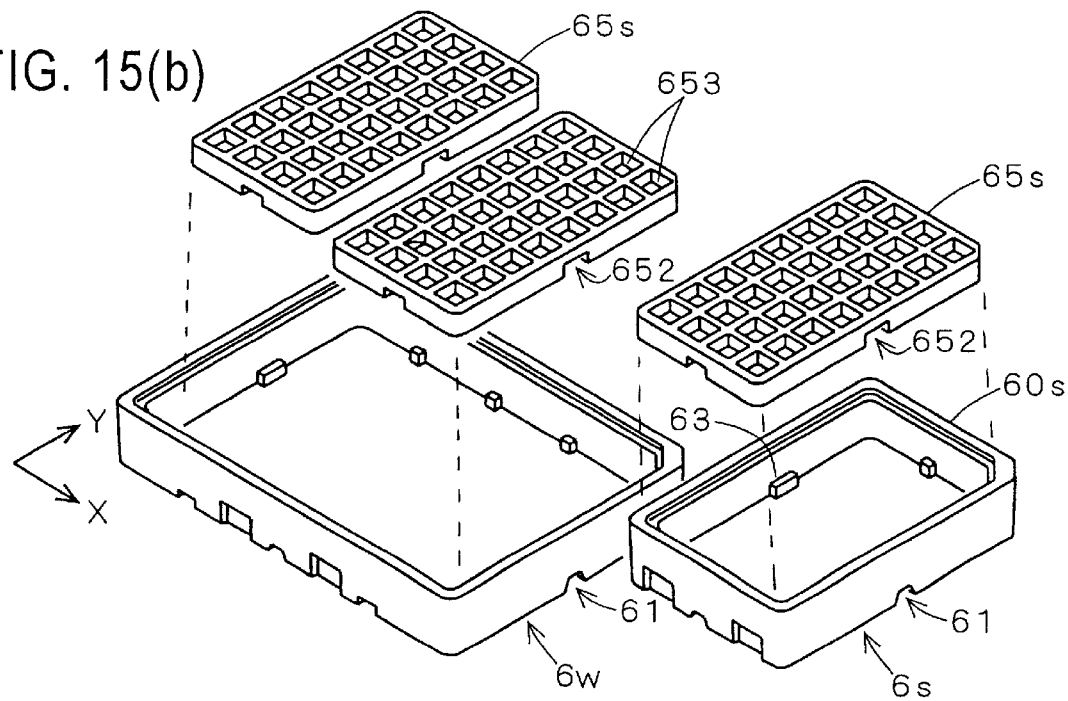

FIGS. 15(a) and 15(b) are drawings that show the structure of the trays.

The tray 6w of the double size, shown in FIG. 15(a), is constituted by a tray main body 60w which is formed by hard plastic, etc. and is comparatively hard, and a core member 65w which is formed by a comparatively soft material such as a molded product of resin foam and is freely detachably housed in the tray main body 60w. The core member 65w is used for aligning housed objects such as parts and finished assembly products, and for positioning them inside the tray, and is formed into a thick plate shape in which aligning holes 651 for aligning a plurality of housed objects are formed. Moreover, a plurality of positioning blocks 224b are placed on the inside corners of the tray main body 60w, and in the core member 65w, positioning grooves 652 that correspond to these blocks 224b are formed. Then, in the same manner as the positioning of the tray 6w with respect to the positioning plate 224w, the respective aligning holes 652 are positioned by the positioning grooves 652 with respect to the tray main body 60w.

The core member 65s of the single size shown in FIG. 15(b) is half the size of the above-mentioned core member 65w in the horizontal X direction, and aligning holes 653 are formed on the upper portion thereof. The tray 6s of the single size is also constituted by a tray main body 60s which is formed by hard plastic, etc. and is comparatively hard, and a core member 65s which is formed by a comparatively soft material such as a molded product of resin foam and is freely detachably housed in the tray main body 60s.

As illustrated in FIG. 15(b), the tray 6w of the double size is allowed to house two of the core members 65s of the single size. In the case when the same number of parts, etc. are housed in the core members 6w and 6s, since the aligning holes 653 of the core member 65s of the single size is smaller than the aligning holes 651 of the core member 65w of the double size, they are more suitable for housing comparatively small-size parts, etc.

Figure 16A:
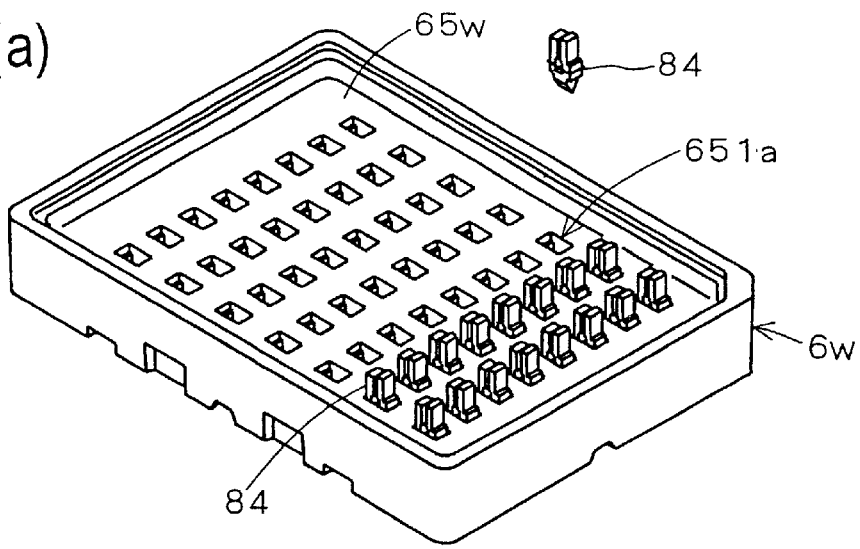
FIGS. 16(a), 16(b) and 16(c) are drawings that show examples in which parts and an assembly product are aligned on the tray.
Figure 16B:
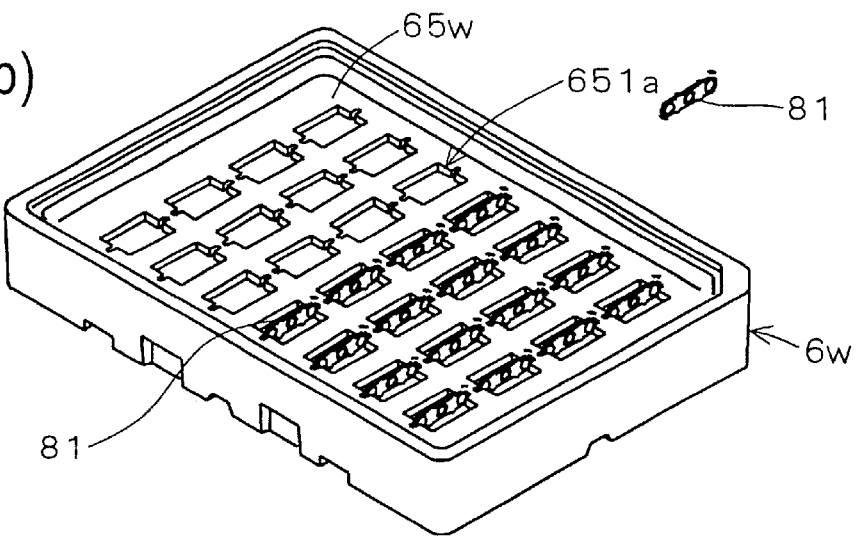
Figure 16C:
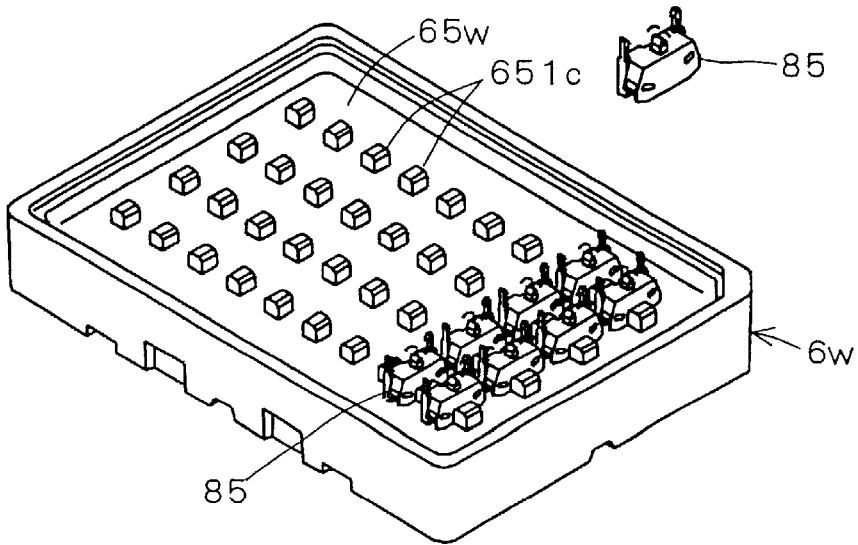

FIGS. 16(a), 16(b) and 16(c) are drawings that show examples in which parts and finished assembly products are arranged in the tray 6w.

As illustrated in FIG. 16(a), parts 84 are inserted to the respective aligning holes 651a of the core member 65w, thereby carrying out the arrangement. Here, the shape of the aligning holes 651a corresponds to the shape of the parts 84; thus, the position of the parts 84 are regulated by the aligning holes 651a. As illustrated in FIG. 16(b), with respect to the parts 81, they are aligned in the tray 6w by the core member 65w having aligning holes 651b that correspond to its shape.

Moreover, with respect to assembly products 85 shown in FIG. 16(c), instead of the aligning holes 651a and 651 b, aligning protrusions 651c are used in the aligning process. Here, each of the assembly products 85 is sandwiched between the aligning protrusions 651c and fixed therein. In this case, the trays shown in FIGS. 16(a) and 16(b) refer to "parts tray", and the tray shown in FIG. 16(c) refers to "assembly product tray".

FIGS. 17(a) and 17(b) are drawings that show examples in which a robot tool 42 is placed on a tray.

The core member 66 shown in FIG. 17(a) is provided with a core member main body 661 having a plurality of positioning grooves 662, and a tool mounting section 663 connected to the upper face of the core member main body 661. The tool mounting section 663 is provided with a plurality of concave sections 663 in the same manner as the tool holder 221. The convex portions 423a of the robot tool 42 are inserted into the concave sections 663 so that the position of the robot tool 42 is regulated and maintained. Then, as illustrated in FIG. 17(b), the robot tool 41, fixed to the core member 66, is housed in the tray main body 60w.

Figure 18A:
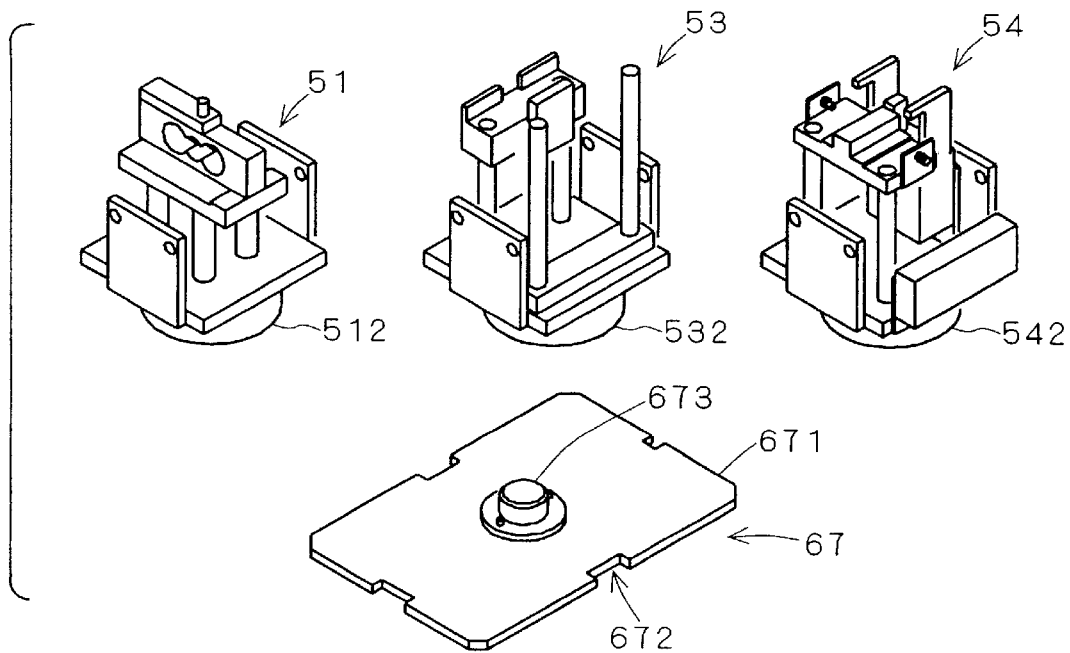
FIGS. 18(a) and 18(b) are drawings that show examples in which an assembling jig is placed on the tray.
Figure 18B:
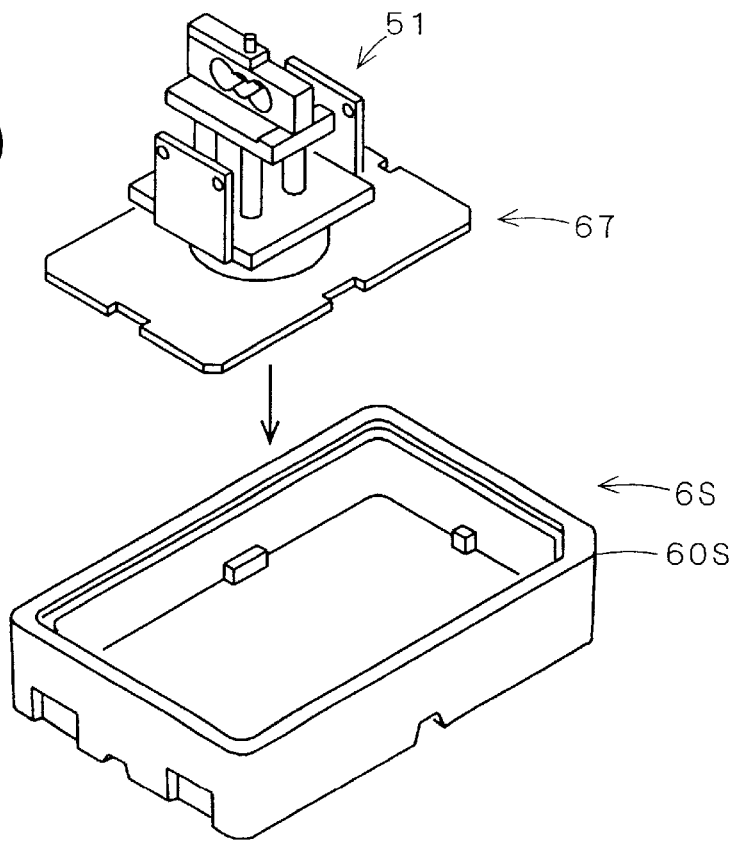

FIGS. 18(a) and 18(b) are drawings that show examples in which each of assembling jigs is placed on a tray.

A core member 67, shown in FIG. 18(a), is provided with a core member main body 671 having a plurality of positioning grooves 672 and a protruding portion 673 placed in the center of the upper face of the core main body 661. The protruding portion 673 is fitted to a hole (not shown) formed in the bottom face of each of the holder connection sections 512, 532, 542 of the assembling jigs 51, 53 and 54 so that each of the assembling jigs is fixed onto the core member 67. Moreover, as illustrated in FIG. 18(b), the assembling jig 51 fixed to the core member 67 is housed in the tray main body 60s. Here, the trays shown in FIGS. 18(a), 18(a) and FIGS. 17(a), 17(b) refer to "assembling tool tray".

Controlling Construction

Figure 3:
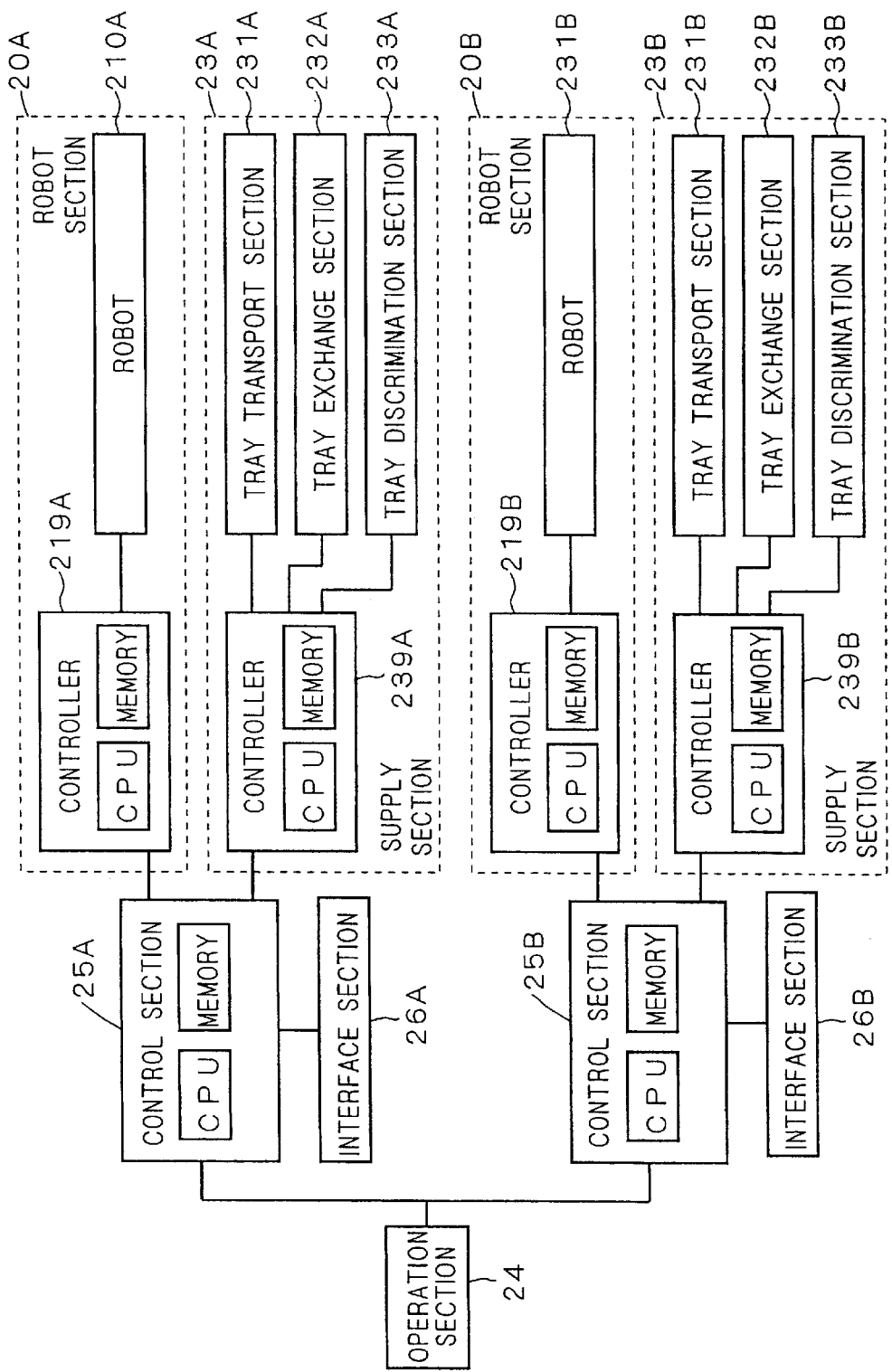
FIG. 3 is a drawing that shows functional blocks of an essential portion of the assembling device 2.

FIG. 3 is a drawing that shows functional blocks of an essential portion of the assembling device 2.

The operation section 24 is electrically connected to control sections 25A and 25B having a CPU and a memory. Moreover, the control section 25A (25B) is electrically connected to a controller 219A(219B) of a robot section 20A(20B), a controller 239A(239B) of a supply section 23A(23B), and an interface section 26A(26B). The controllers 219A, 239A (219B, 239B) are also provided with CPUs and memories. The controller 219A(219B) is connected to a robot 210A(210B), and the controller 239A(239B) is connected to a tray transport section 231A(231B), a tray exchange section 232A(232B) and a tray discrimination section 233A(233B).

Here, the control sections 25A, 25B function as a robot control means, and also function as a tool managing control means and an assembling control means.

The operation section 24, which has an activating button, a stop button, etc., is provided with a display which displays the operative state of the assembling device 2.

The control sections 25A and 25B totally control the respective movable sections of the assembling device 2 in response to the operation of the operator at the operation section 24 while the respective CPUs and memories are operated in cooperation with each other.

The interface sections 26A, 26B are allowed to read a recording medium in which control data related to the control section 25A is written. Here, the interface sections 26A, 26B may be connected to transfer lines, and they may receive control data from the design assisting device 3 through the transfer lines.

Construction of the Design Assisting Device

Figure 19:
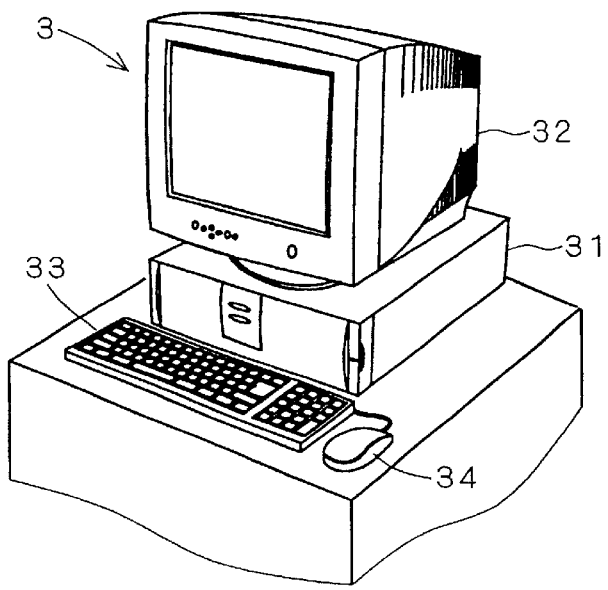
FIG. 19 is a perspective view that shows a design assisting device 3.

FIG. 19 is a perspective view that shows a design assisting device 3.

The design assisting device 3 is provided with a device main body 31, a display 32, a key board 33 and a mouse 34.

Figure 20:
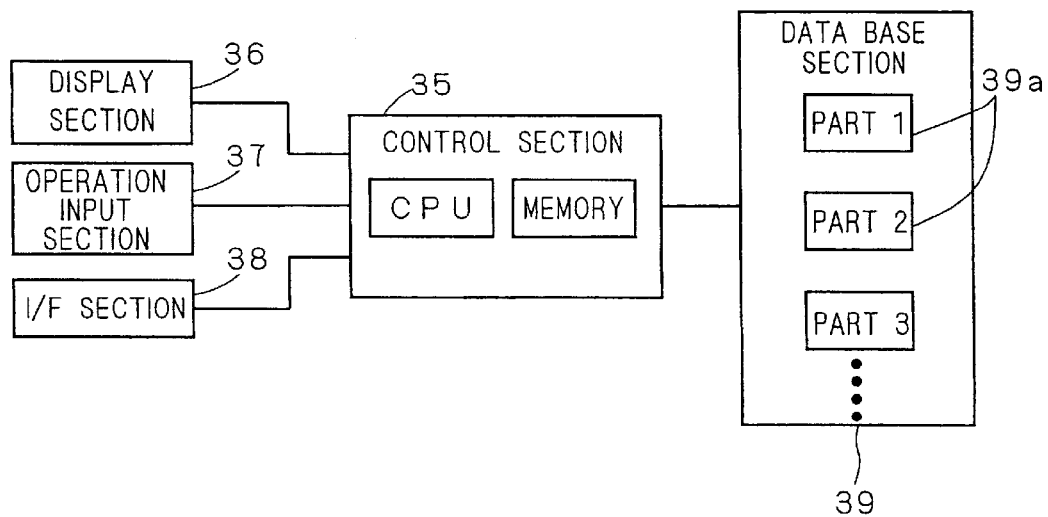
FIG. 20 is a drawing that shows functional blocks of the design assisting device 3.

FIG. 20 is a drawing that shows functional blocks of the design assisting device 3.

The design assisting device 3 has a control section 35, a display section 36 electrically connected to the control section 35, an operation input section 37, an interface section 38 and a data base section 39.

The control section 35 is installed inside the device main body 31, and provided with a CPU and a memory.

The display section 36 corresponds to the display 32, and displays various screens based upon instructions from the control section 35.

The operation input section 37 corresponds to the key board 33 and the mouse 34, and can be operated by the operator.

The interface section 38 outputs control data, etc. of a robot processed in the control section 35 to a recording medium. Here, a transfer line may be connected to the interface section 38, and the control data may be transmitted to the control sections 242A, 242B of the assembling device 2 through the transfer line.

Moreover, in the data base section 39, handling operations for the respective parts are classified and defined, thereby providing operation module 39a, which is stored in the memory device as data base.

Operation of the Assembling System 1

Operation of the Assembling Device 2

Figure 21:
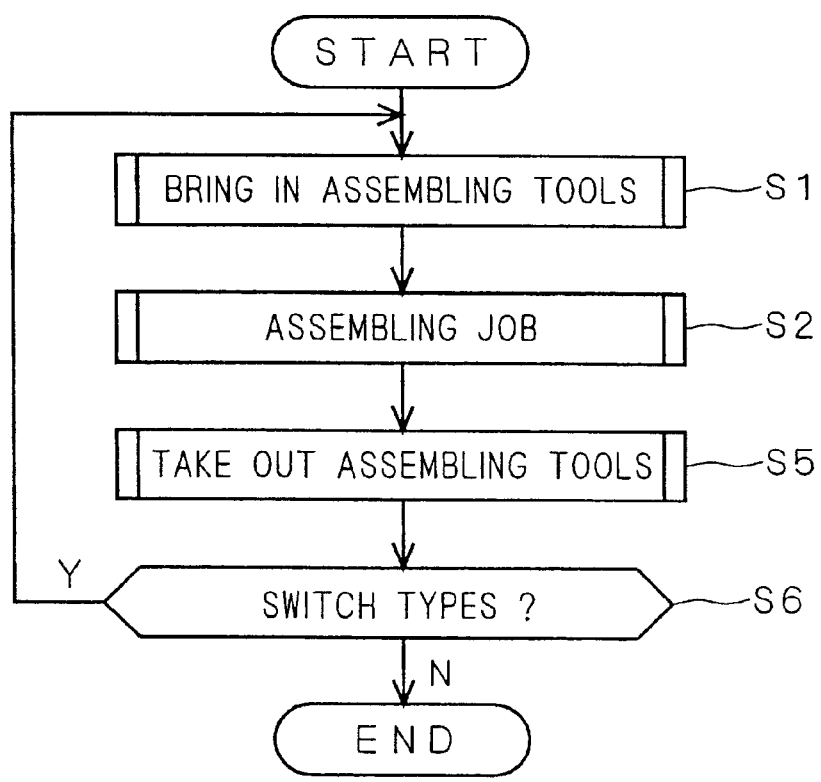
FIG. 21 is a flow chart that explains the outline of the operation of the assembling device 2.

FIG. 21 is a flow chart that explains the outline of the operation of the assembling device 2. Referring to this Figure, the following description will discuss the basic operation.

At step S1, an assembling tool constituted by a robot tool and an assembling jig is automatically transported into the movable range RA and RB of the robot, and the setting is also automatically carried out.

At step S2, the assembling tool thus transported at step S1 is used, and an assembling job for successively assembling a plurality of parts by the robots 210A and 210B is repeated a predetermined times.

At step S5, an assembling tool that is no longer required after completion of the assembling job is taken out of the movable ranges RA, RB of the robots.

As step S6, a judgment is made as to whether or not a switchover is made between types of assembly products. In the case when a switchover is made between types of assembly products, the sequence returns to step S1, and the assembling job is continued through the same sequence. Thus, even in the case of dealing with various types, the switchover between assembling tools is continuously carried out without the dependence on human hands.

Figure 22:
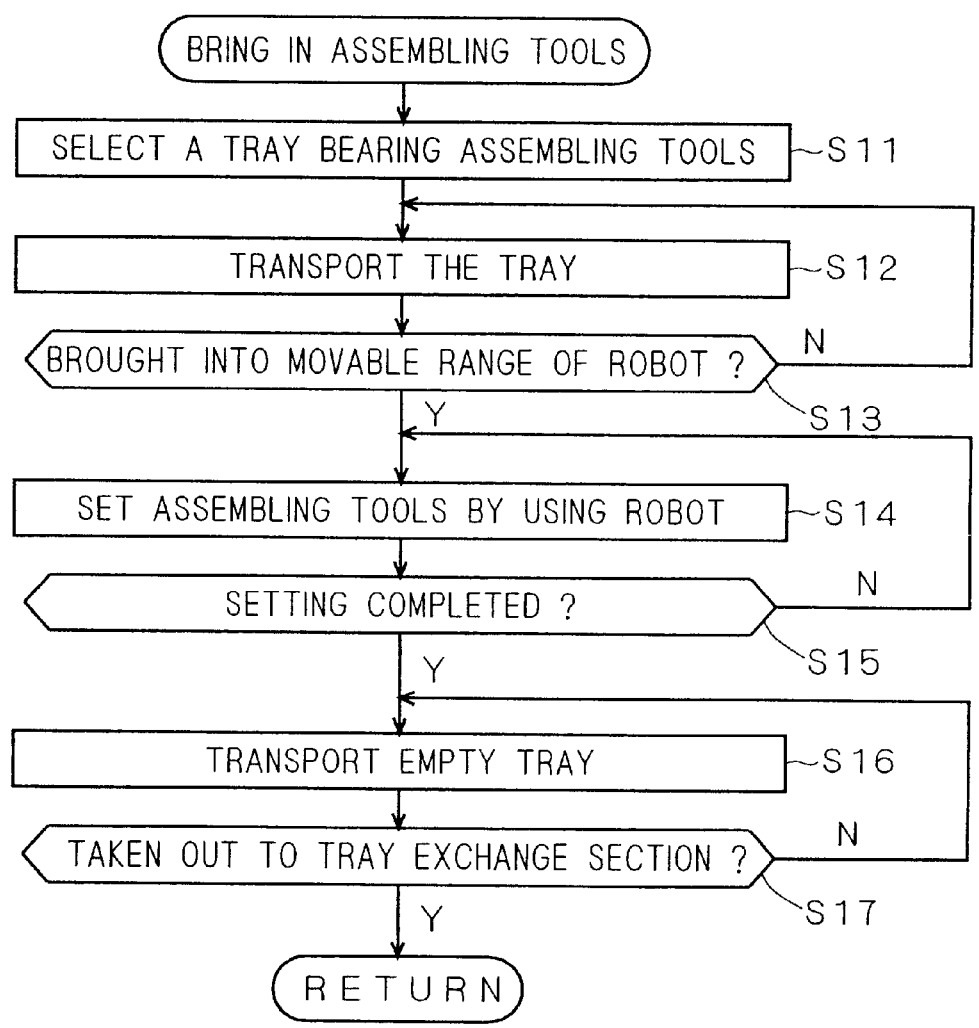
FIG. 22 is a flow chart that explains the bringing-in operation of the assembling tools.

FIG. 22 is a flow chart that explains the bring-in operation of assembling tools, and that corresponds to S1 in the flow chart shown in FIG. 21.

At step S11, selection is made from assembling tool trays. In other words, at the tray exchange section 232, an assembling tool tray is selected. Here, if a predetermined assembling tool tray is not selected, an alarm is generated by the tray discrimination section 233.

At step S12, the assembling tool tray, selected at the step S11, is transported. In this case, the tray transport section 231 is driven so that the assembling tool tray is automatically transported from the outside of the movable ranges RA, RB of the robots 210A, 210B to the positioning plate 224 within the movable range RA, RB. Thus, a plurality of types of the robot tools are brought therein.

At step S13, a judgment is made as to whether or not the assembling tool tray has been brought in the movable ranges RA, RB of the robots. If it has been brought in the movable ranges of the robots, the sequence proceeds to step S14, and if it has not been brought therein, the sequence proceeds to step S12.

At step S14, the assembling tools are automatically set by the robots 210A and 210B. In other words, a robot tool that has been preliminarily selected among a plurality of types of robot tools placed in the tool holder 221 at the initial stage is taken out, and attached to the mechanical hands 211A, 211B. Then, the assembling tools, that is, the robot tools and assembling jigs, which have been brought in the movable ranges RA, RB of the robots 210A, 210B, are respectively transported to predetermined positions, that is, a tool holder 221 and a jig holder 222, and arranged thereon by the robots 210A and 210B.

At step S15, a judgment is made as to whether or not the settings have been completed. In other words, in the case when all the settings have been completed, the sequence proceeds to step S16, and if they have not been completed, the sequence returns to step S14.

At step S16, the tray transport section 231 is driven, and the assembling tool tray which has become empty after completion of the settings of all the assembling tools is transported from the movable ranges RA, RB of the robots 210A, 210B to the outside of the movable ranges RA, RB.

At step S17, a judgment is made as to whether or not the empty tray has been transported to the tray exchange section 23. If it has been transported to the tray exchange section 23, the sequence proceeds to step S2, and if it has not been transported thereto, the sequence returns to step S16.

Figure 23:
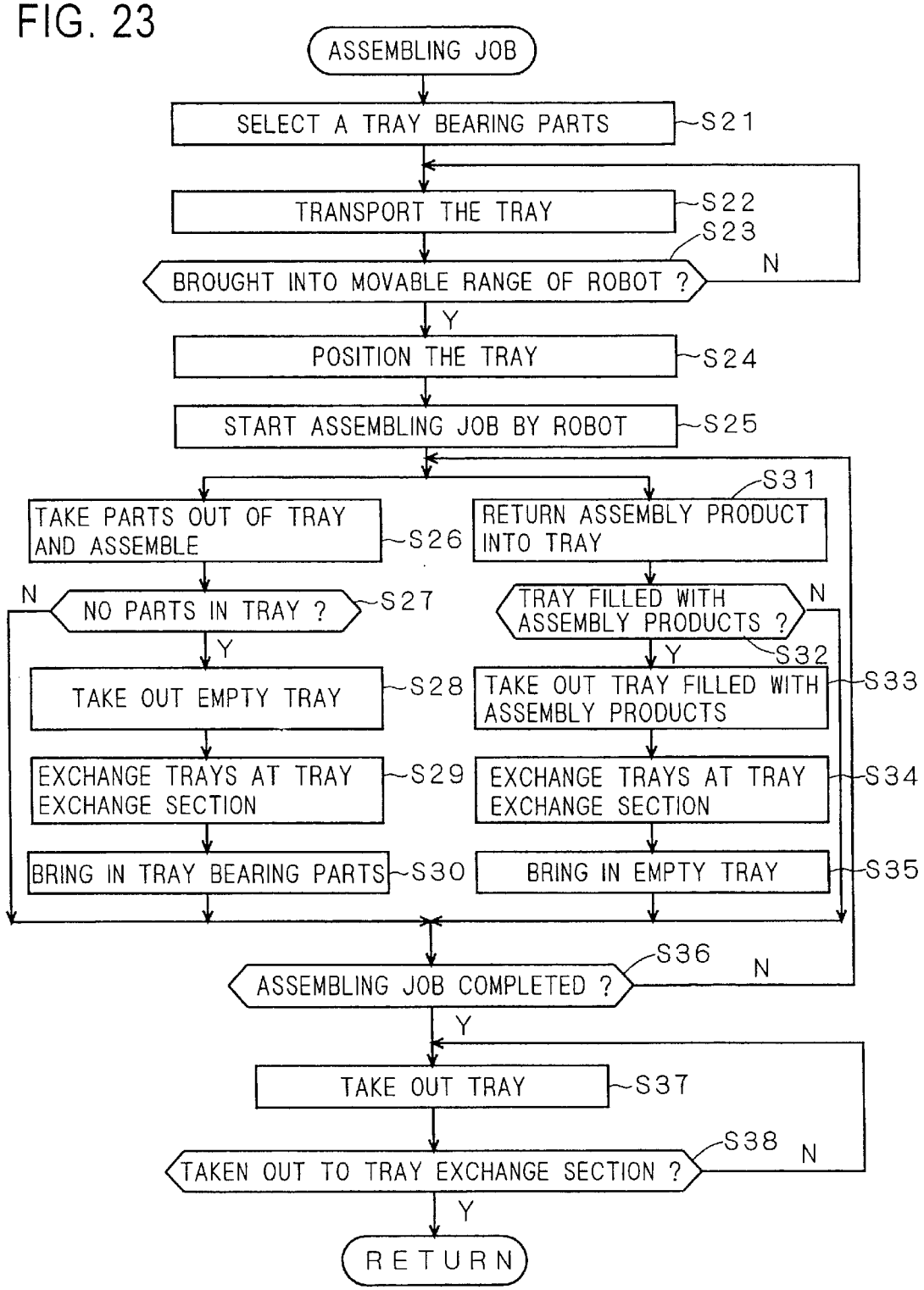
FIG. 23 is a flow chart that explains the processes of the assembling operation.

FIG. 23 is a flow chart that explains the operation of an assembling job, and corresponds to step S2 of the flow chart shown in FIG. 21.

At step S21, selection is made among parts trays. In other words, at the tray exchange section 232, a parts tray that is currently located on the uppermost section among a plurality of parts trays stacked. Here, if a predetermined parts tray has not been selected, an alarm is generated by the tray discrimination section 233.

At step S22, the corresponding parts tray is transported. More specifically, the tray transport section 231 is driven so that the parts tray is automatically transported from the outside of the movable ranges RA, RB of the robots 210A, 210B to the positioning plate 224 within the movable range RA, RB.

At step S23, a judgment is made as to whether or not it has been transported to the inside of the movable ranges RA, RB of the robots 210A, 210B. If it has been transported to the inside thereof, the sequence proceeds to step S24, and if it has not been transported thereto, the sequence returns to step S22.

At step S24, the positioning of the parts tray thus brought in is carried out. In other words, the parts tray is positioned within the movable ranges RA, RB of the robots by the positioning plate 224.

Such a bring-in operation of the parts trays is executed so as to automatically transport parts trays the number of which corresponds to the parts in parallel with each other; thus, respective parts, required for an assembling job, are arranged in the vicinity of the robot section 10A, 10B, thereby making it possible to start the assembling job.

At step S25, the assembling job is started by robots 210A, 210B.

At step S26, the parts within the tray are taken out and assembled. More specifically, the exchanging of the robot tools is properly carried out in accordance with the types of parts, etc., and the parts within the tray thus brought in are picked up by alternately using the robots 210A, 210B and transported by the assembling jig so as to be assembled. In this case, one of the robots 210A, 210B may be used continuously, if necessary. Moreover, if exchanging of the robot tool is required in the course of the assembling job, the robot 210A (210B) exchanges the robot tool used presently with another robot tool that is in a stand-by state in the tool holder 211. In other words, the robot tool is automatically exchanged by the robot 210A(210B) in accordance with the assembling stage of the assembly product.

At step S27, in accordance with the progress of the assembling job of the parts within the parts trays, a judgment is made as to whether or not any empty tray exists. If any empty tray exists, the sequence proceeds to step S28, and if there is no empty tray, the sequence proceeds to step S36.

At step S28, the empty parts tray is automatically transported from the movable ranges RA, RB of the robots 210A, 210B to the tray exchange section 232.

At step S29, the empty parts tray (used tray) is exchanged with another parts tray (tray to be used next) in which other parts are placed, at the tray exchange section 232.

At step S30, the parts tray to be used next in which the parts are placed is transported to the movable ranges RA, RB of the robots 210A, 210B.

Normally, the same number of parts are housed in the respective parts trays; therefore, once one tray becomes empty with the parts having been used up, another parts tray also becomes empty. Consequently, a plurality of parts tray are exchanged with the parts tray to be used next in parallel with each other in terms of time; however, in the case when the timing when any parts tray becomes empty is different depending on the trays, each time any of the parts trays becomes empty, a sequence of processes in which the parts tray is automatically taken out and stored on the lowermost stage of the tray stack body and the parts tray on the uppermost stage is automatically brought in is continuously carried out, and until these processes have been finished, the repeated assembling processes by the use of the robots 210A, 210B are temporarily suspended, and maintained in a stand-by state.

The steps after step S31 are operations carried out in parallel with the above-mentioned steps S26 to S30.

In other words, in step S31, when one assembly product is completed, this is transported in an assembly product tray by the robot 210A or 210B. The assembly product tray has been automatically transported in any one of positions of the positioning plates 224 preliminarily, in an empty state, in parallel with the parts trays.

At step S32, a judgment is made as to whether or not the assembly product tray has been filled through the repetition of the transporting process of the step S31. If it has been filled, the sequence proceeds to step S33, and if it has not been filled, the sequence proceeds to step S36.

At step S33, the tray filled with the assembly products is automatically transported from the movable ranges RA, RB of the robots 210A, 210B to the tray exchange section 232.

At step S34, the assembly product tray filled with the assembly products is exchanged with an empty assembly product tray at tray exchange section 232.

At step S35, the empty assembly product tray is automatically transported to the movable ranges RA, RB of the robots 210A, 210B.

At step S36, a judgment is made as to whether or not all the assembling jobs for the corresponding type has been completed. If it has been completed, the sequence proceeds to step S37, and if it has not been completed, the sequence returns to step S26, S31.

At step S37, all the trays located within the movable ranges RA, RB of the robots 210A, 210B are automatically transported.

At step S38, a judgment is made as to whether or not all the trays has been taken out to the tray exchange section 232. If they have been transported thereto, the sequence proceeds to step S5, and if they have not been transported, the sequence returns to step S37.

Figure 24:
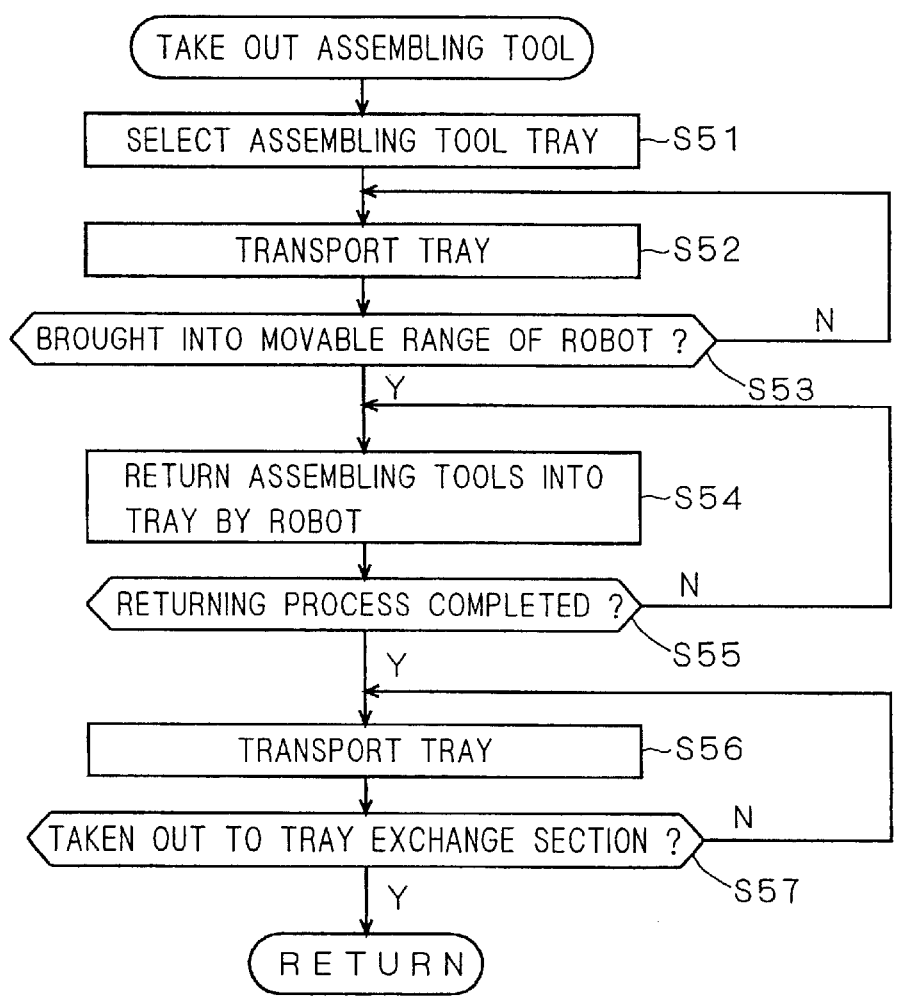
FIG. 24 is a flow chart that explains the taking-out operation of the assembling tools.

FIG. 24 is a flow chart that explains the transporting operation of the assembling tools, and corresponds to step S5 of the flow chart of FIG. 21.

At step S51, an empty assembling tool tray is selected at the tray exchange section 232. Here, if a predetermined tray has not been selected, an alarm is generated by the tray discrimination section 233.

At step S52, an empty assembling tool tray is transported into the movable ranges RA, RB of the robots 210A, 210B. Here, the tray transport section 231 is driven to transport the tray.

At step S53, a judgment is made as to whether or not the empty assembling tool tray has been transported into the movable ranges RA, RB of the robots 210A, 210B. If it has been transported therein, the sequence proceeds to step S54, and if it has not been transported therein, the sequence returns to step S52.

At step S54, the corresponding assembling tools are returned to the empty assembling tool tray thus transported by the robots 210A, 210B.

At step S55, a judgment is made as to whether or not the returning operation to the assembling tool tray has been competed by the robots 210A, 210B. If it has been completed, the sequence proceeds to step S56, and if it has not been completed, the sequence returns to S54.

At step S56, the assembling tool subjected to the returning operation is driven by the tray transport section 231 to be taken out.

At step S57, a judgment is made as to whether or not the tray bearing the assembling tools has been taken out to the tray exchange section 232. If it has been taken out, the sequence proceeds to step S6, and if it has not been taken out, the sequence returns to step S57.

The above-mentioned operation makes it possible to automatically bring not only parts, but also assembling tools into the movable ranges RA, RB of the robots 210A, 210B; and the above-mentioned operation also makes it possible to automatically take not only finished assembly products, but also assembling tools that are no longer used after the change of the type, out of the movable ranges RA, RB of the robots 210A, 210B; therefore, it is possible to efficiently produce a small number of many types of products by using the assembling device 2.

Moreover, in a normal operational state, since no operator needs to enter the movable ranges RA, RB of the robots 210A, 210B, no danger is caused by the movements of the robots 210A, 210B.

In particular, in the case of a robot using a reducer, since the output torque is great, it is preferable to inhibit the operator from entering the movable range of the robot from the viewpoint of safety; therefore, the device of the present preferred embodiment is suitable for this demand.

Operation of the Design Assisting Device 3

Figure 25:
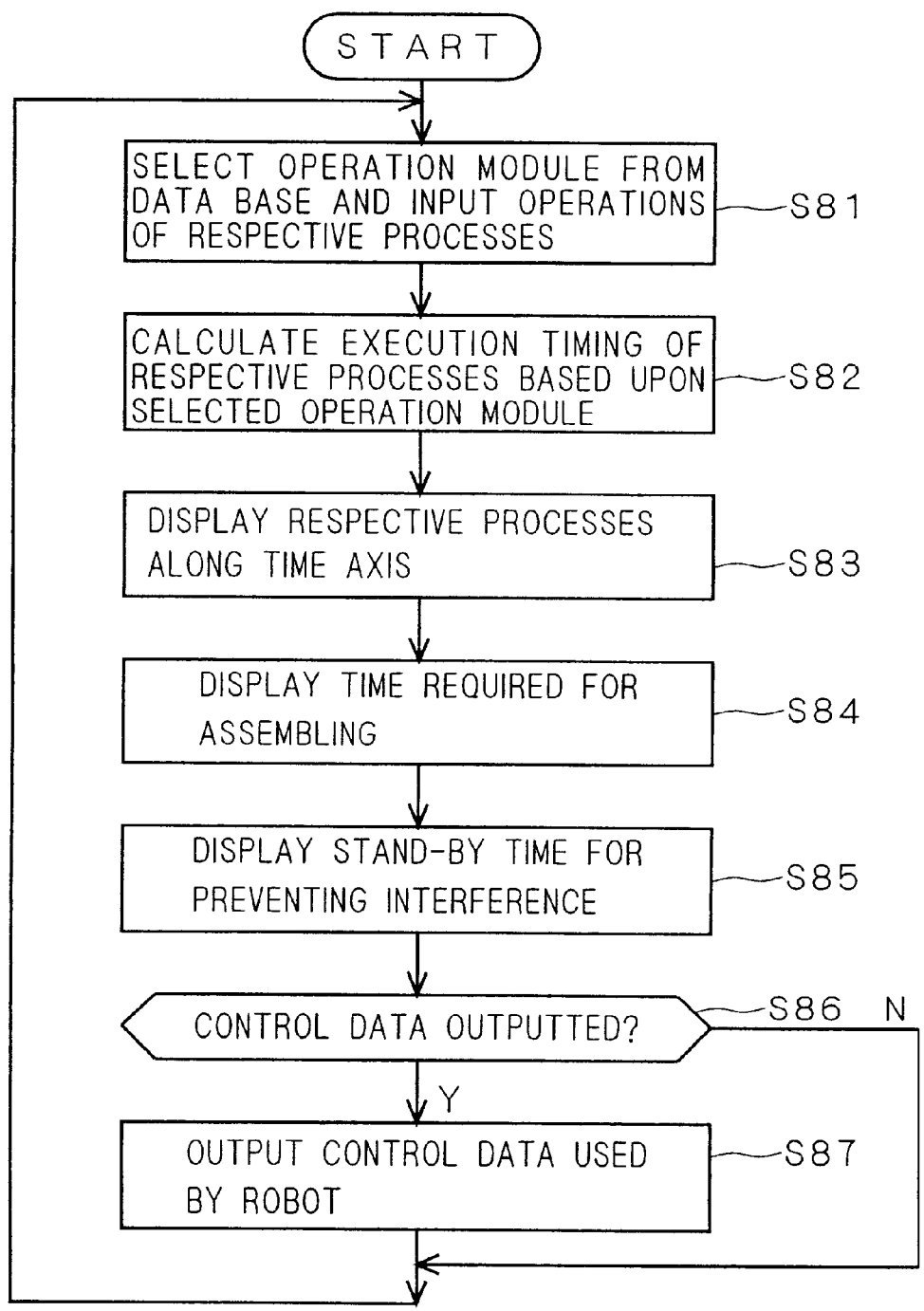
FIG. 25 is a flow chart that explains the outline of the operation of the design assisting device 3.

FIG. 25 is a flow chart for explaining the outline of the operation of the design assisting device 3. Referring to the Figure, the following description will discuss the basic operation.

At step S81, an operation module is selected from data base, and operations of the respective processes are inputted.

Figure 26:
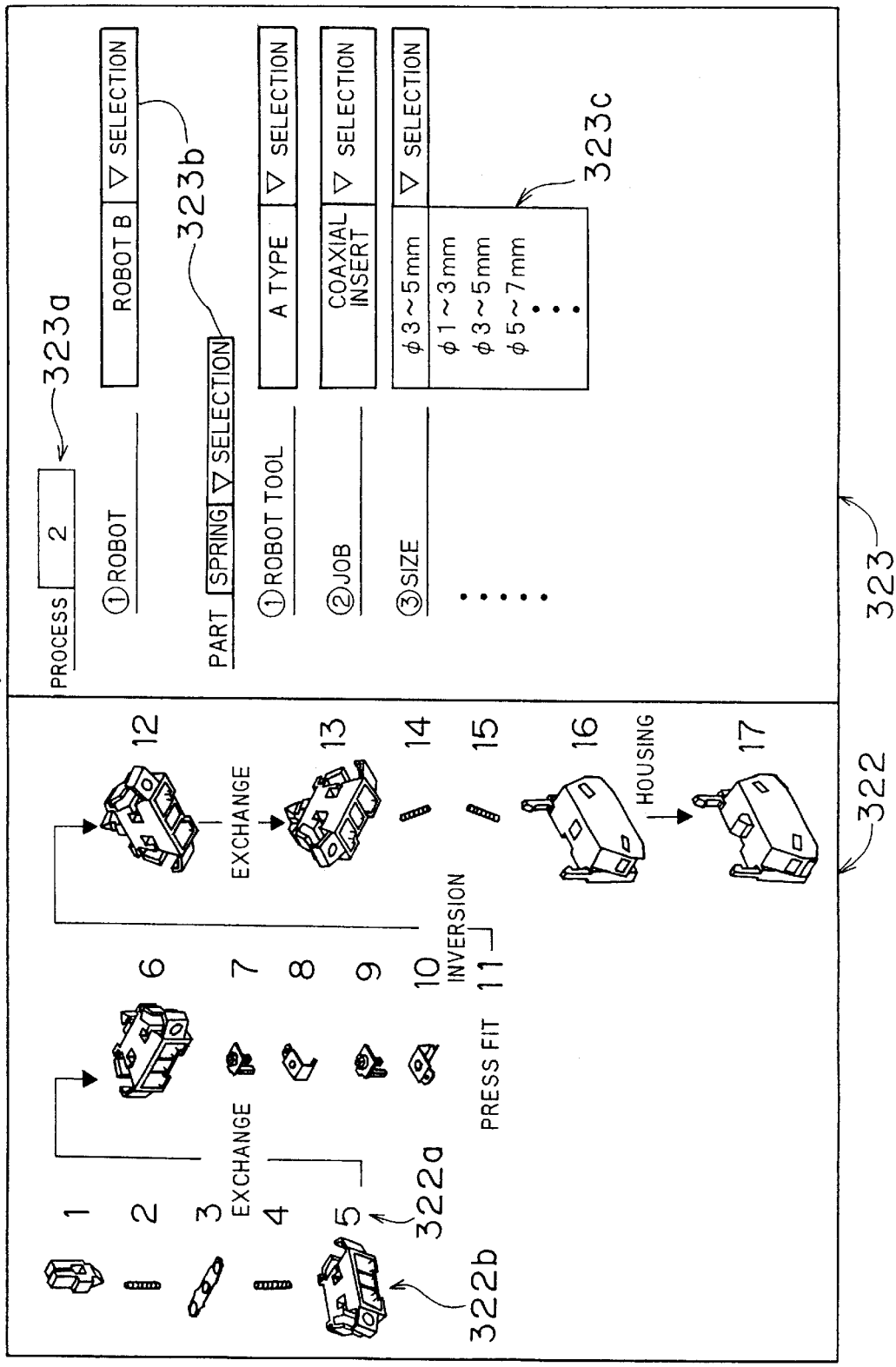
FIG. 26 is a drawing that shows an example of a screen 321 in which operations for the respective processes are inputted.

FIG. 26 is a drawing that shows an example of a screen 321 to which the operations of the respective processes are inputted. This screen 321 is constituted by a process display screen 322 for displaying the outline of the flow of the respective processes, and a process input screen 323 through which the operations of the respective processes are inputted.

The process display screen 322 includes a process number display 322a for displaying the respective processes by using serial numbers, and images 322b of parts that the respective processes deal with. The process display screen 322 allows the operator to visually confirm parts to be used in an assembling process.

Moreover, the process input screen 323 is provided with a number input section 323a and a plurality of selection buttons 323b. The number input section 323a is used for inputting process numbers, and process numbers are inputted through the operation on the key board 33. Moreover, the selection buttons 323b are buttons used for selecting required data from a plurality of operation modules stored in the data base section 39. When the selection button 323b is clicked through the operation of the mouse 34, a plurality of selectable data displays 323c appear, and in the displays 323c, required data is selected among the plurality of data through the operation of the mouse 34 so that a data input is carried out.

At step S82, based upon the selected operation module, the execution timing of each of the processes is calculated. This calculation is executed by the CPU in the control section 35. For this reason, each operation module is designed to include information related to, for example, a robot movement required for each unit operation and time required for its operation, such as a sequence of operations required for an assembling process for one cycle with respect to a certain part. These modules are classified, and the contents are described as follows:

In other words, for example, in the case when a screw serving as one part is driven from above, even if the sizes of screws are different slightly from each other, the screwing operation is virtually the same. Therefore, on the data base, the difference is not taken into consideration, and operations having basically similar operational states are defined as one operation module, and registered.

Moreover, for example, in the case when a screw is inserted into a predetermined hole in a given direction, items such as the number of threads in the screw, etc., are omitted, and the similar operations are defined as one operation belonging to a common category, that is, one module.

In this manner, similar operations are classified so that it becomes possible to easily form assembling processes, and consequently to provide a quick, accurate designing operation.

At step S83, the respective processes are displayed along the time axis.

Figure 27:
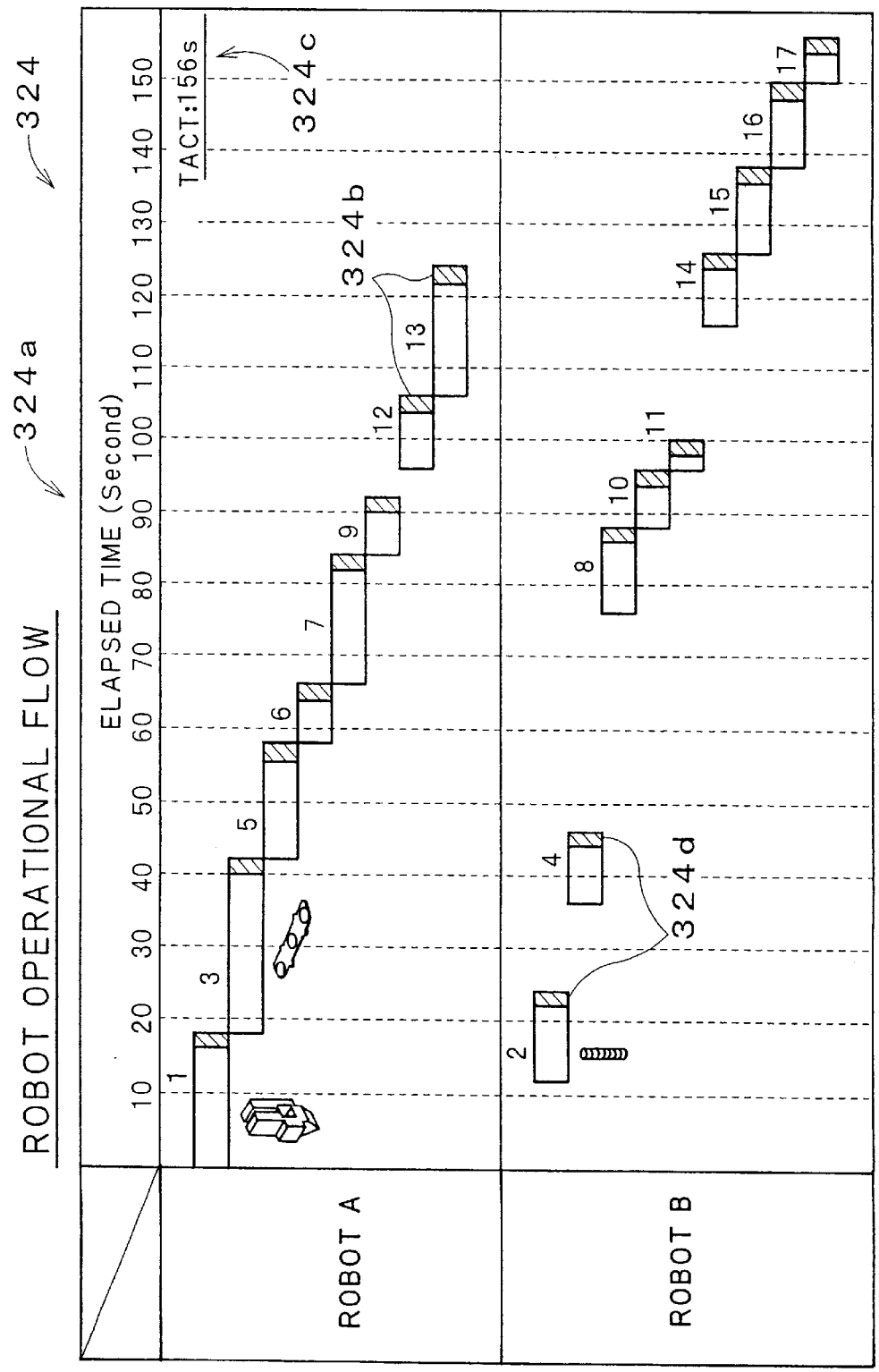
FIG. 27 is a drawing that shows an example of a screen 324 that displays the operation flow of the robots.

FIG. 27 is a drawing that shows an example of the screen 324 for displaying an operational flow of a robot. The screen 324 is provided with a time display section 324a for displaying elapsed time from the start of a job, and a bar graph 324b that displays required periods of time for the respective processes. The graphical display given by this screen 324 makes it possible to visually confirm the operational state of each robot.

Moreover, as illustrated in FIG. 27, images of parts that are to be assembled in respective processes are displayed together with the bar graph 324b so that it becomes possible to easily confirm which process is related to which parts. Here, with respect to all the processes, images related to the corresponding process are displayed; however, for convenience of explanation, in FIG. 27, images of parts are given only on one portion of the processes.

At step S84, all the periods of time (tact time) required for the assembling process for one assembly product are calculated, and displayed as numerical values. More specifically, as shown in the display 324c in FIG. 27, based upon the execution timing for the respective processes calculated in step S82, these values are displayed on the display 32.

At step S85, periods of stand-by time for preventing interference are calculated and displayed. More specifically, as illustrated in the display 324d (indicated by parallel slanting lines) of FIG. 27, the time zones in which the robots 210A, 210B enter an interference area are displayed in a manner so as to be easily distinguished from the other time zones. In other words, the common movable range RC forms an interference area in which the robots 210A and 10B are allowed to interfere with each other; therefore, when one of the robots is located in the common movable range RC, it is preferable to put the other robot in a stand-by state. Thus, with respect to the robot other than the one located in the common movable range RC, the time zones in which it has to be in the stand-by state are confirmed, and it is possible to prevent the robots from colliding with each other by carrying out calculations so as not to make the displays 324d overlap each other on the time axis. More specifically, in the case when one robot comes to enter the common movable range RC with a part, etc. being held thereon, if the other robot is located in the common movable range RC, the period of time to be elapsed until the other robot goes out of the common movable range RC is calculated, and the period of time is displayed as a stand-by time.

In the case when a sequence that has been obtained by the above-mentioned selections and displays is not satisfactory, for example, in the case when the tact time is quite longer than a desired one, and when the stand-by time of one robot is excessive, for example, robots to be used for the respective operations may be changed; thus, an operational sequence after the change can be displayed, and at the stage where the process designer finally satisfies with the results obtained, the operational sequence is determined.

At step S86, based upon the operational sequence thus determined, a judgment is made as to whether or not the corresponding control data should be outputted to a portable recording medium in the interface section 38. If this is outputted thereto, the sequence proceeds to step S87, and if it is not outputted thereto, the sequence proceeds to step S81.

At step S87, the control data to be used in the robot is outputted to the recording medium in the interface section 38. Thus, the control data related to the assembling job, inputted at the design assisting device 3, is inputted to the assembling device 2 through the recording medium.

Here, such a transferring process of the operational sequence may be carried out through an on-line communication made by on-line connecting the assembling device 2 and the design assisting device 3.

The above-mentioned operation makes it possible to efficiently produce a small number of many types of products by the use of robots through the design assisting device 3.

Other Example of the Layout of Robots

Figure 28:
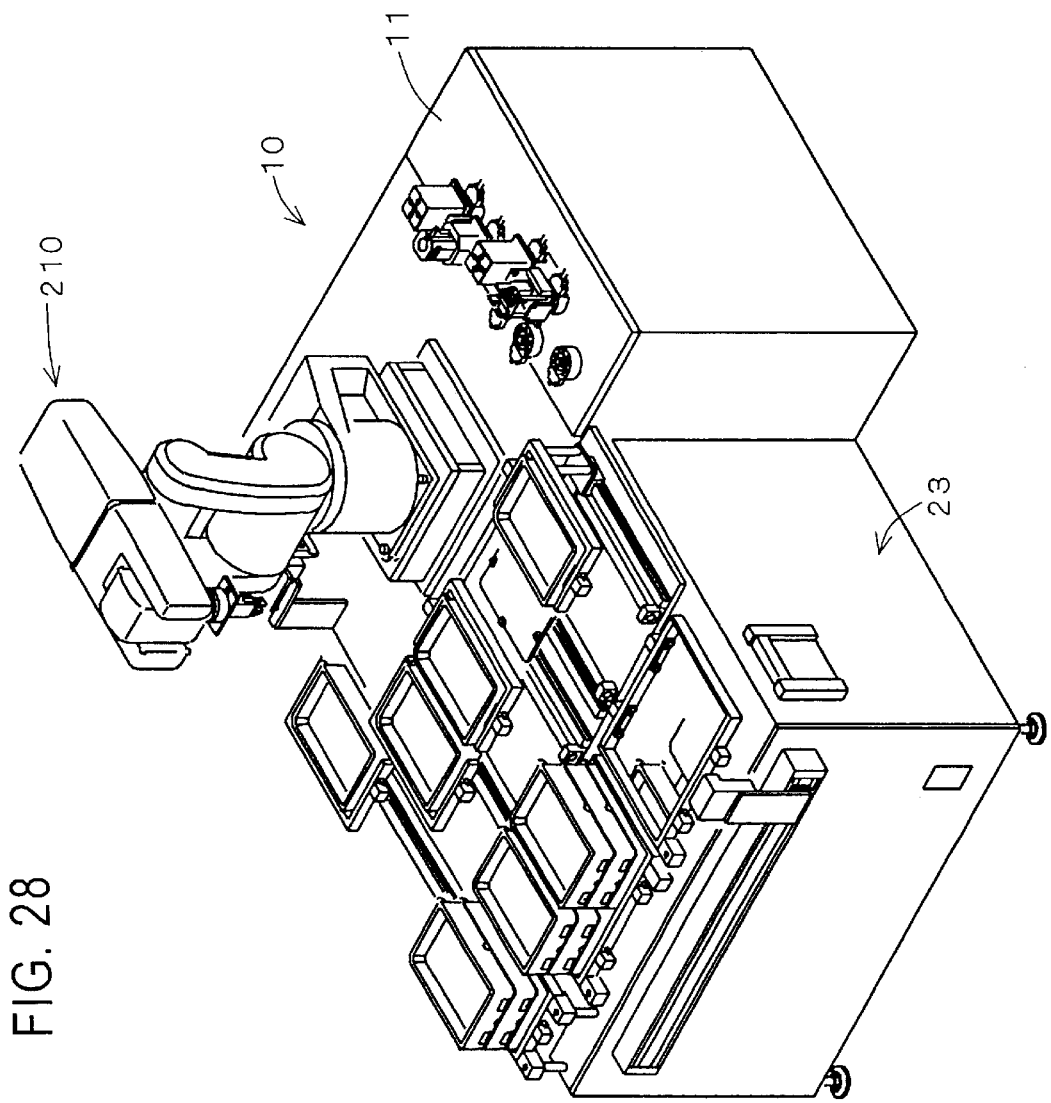
FIG. 28 is a perspective view that shows a basic unit of the assembling device.

The above-mentioned assembling device 2 is provided with two robots 210A, 210B; however, the present invention may be realized in various modes. In other words, as illustrated in FIG. 28, one robot 210, a workbench 11 adjacent thereto and a supply section 23 are allowed to form a minimum unit; and these units may be arranged in various ways, as shown in FIGS. 29(a) and 29(b).

Figure 29A:
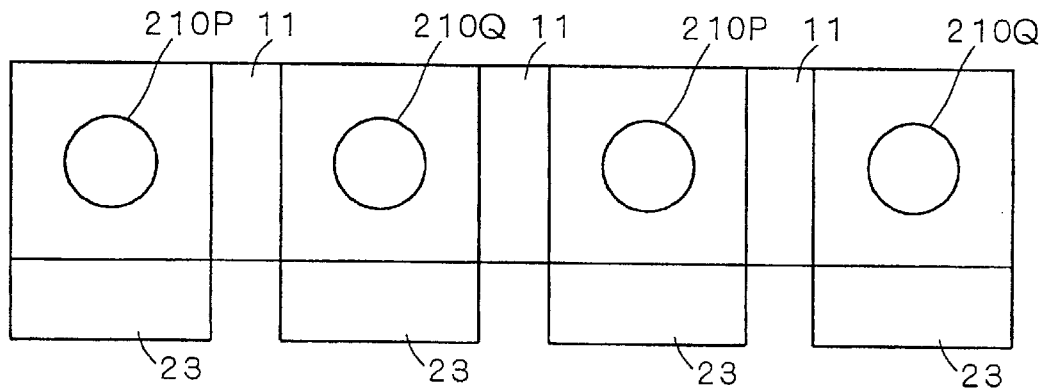
FIGS. 29(a) and 29(b) are drawings that show the layout of an assembling device in accordance with a modified example.
Figure 29B:
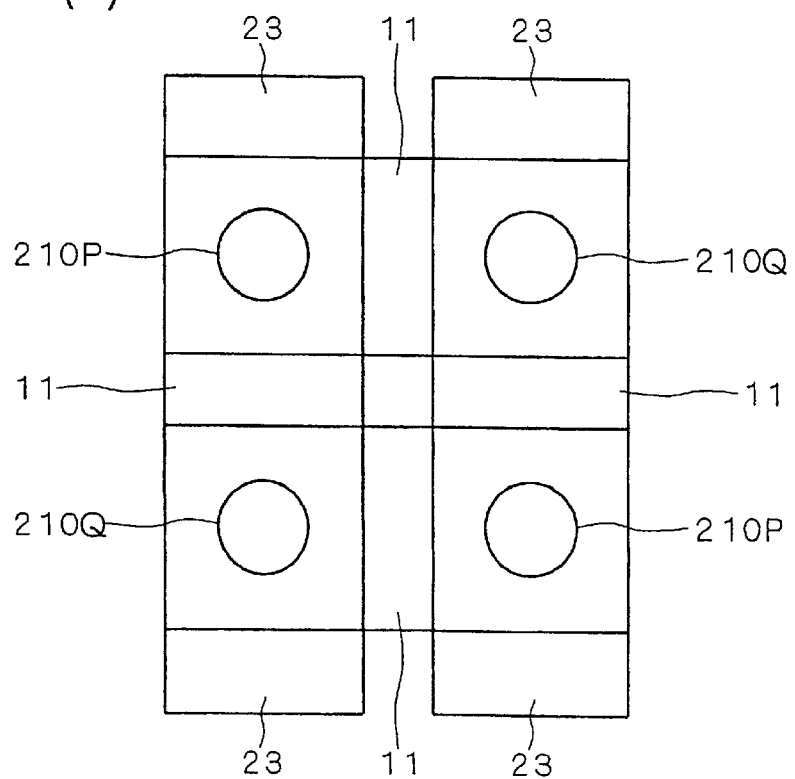

In either of the cases shown in FIGS. 29(a) and 29(b), the workbench 11 is placed between a pair of adjacent robots, and at least one portion of the workbench 11 is located within the movable ranges of the adjacent robots. Therefore, in any workbenches 11, a plurality of robots are allowed to operate in cooperation with each other.

In particular, robots 210P, 210Q, having different degrees of freedom in operation, are one-dimensionally (FIG. 29(a)) or two-dimensionally (FIG. 29(b)) aligned alternately; thus, in any of the workbenches, it is possible to carry out a cooperative operation between the robots 210P and 210Q having different degrees of freedom in operation.

Moreover, by using bases having a rectangular shape in the plan view, the layout of this type is continuously formed actually without any gaps, thereby making it possible to save space effectively.

Therefore, the device of the present invention provides high productivity and a highly-safety system with superior flexibility.

What is claimed is:

1. An assembling device, which successively assembles a plurality of parts by utilizing assembling tools so as to manufacture a predetermined assembly product, comprising:

(a) an assembling section having a robot placed on a predetermined base;

(b) robot controlling means for driving and controlling said robot;

(c) transport means which transports said plurality of parts and said assembling tools from the outside of a movable range of said robot to inside of said movable range as bringing-in objects and also transport a finished assembly product and a used assembling tool from inside of said movable range to the outside of said movable range as taking-out objects, wherein said robot control means comprises:

(b-2) tool management control means for allowing said robot to carry out a setting process of said assembling tools that have been brought therein and a returning operation of said used assembling tools to said transport means; and (b-2) assembling control means for allowing said robot to carry out an assembling process of said plurality of parts that have been brought therein and a returning operation of the finished assembly product to said transport means.

2. The assembling device according to claim 1, wherein: said assembling tools comprise:

a robot tool that is detachably attached to a tip of an arm of said robot; and an assembling jig that is placed on a workbench added to said base and that assembles said plurality of parts, and said tool management control means comprises:

robot tool management control means for allowing said robot to attach and detach said robot tool to and from said tip of the arm; and jig management control means for allowing said robot to shift said assembling jig between a predetermined assembling position on said workbench and said transport means.

3. The assembling device according to claim 2, wherein:

a plurality of types of robot tools are transported said transport means, and said robot tool management control means comprises:

robot-tool transport control means for transporting said plurality of types of the robot tools to a predetermined robot-tool stand-by position on said base by using said robot; and robot-tool exchange control means for selecting a robot tool to be attached to said tip of the arm among said plurality of types of robot tools so as to exchange a corresponding robot tool, in accordance with each stage of said assembling processes of said assembly product.

4. The assembling device according to claim 2, wherein:

a chuck, which pinches each of said plurality of parts, is used as said robot tool, and in a section within an operational range of said robot, from each of the respective bring-in positions of said plurality of parts to said assembling each transport path in a single direction for each of the parts, traced by said robot, is allowed to pass through a predetermined common position, and said assembling device comprises (d) parts detection means, placed in a vicinity of said common position, for detecting whether or not said chuck on said robot is pinching any part.

5. The assembling device according to claim 1, wherein: said transport means comprises:

(c-1) a parallel arrangement of a plurality of tray holding sections, each capable of holding the corresponding tray; and (c-2) transport driving means for shifting each of said plurality of tray holding sections between the inside of said robot movable range and the outside thereof; and wherein each of said bringing-in objects and said taking-out objects is transported by said transport means in a housed state in said tray.

6. The assembling device according to claim 5, wherein: said plurality of tray holding sections comprises:

a first tray holding section for holding a tray having a predetermined unit width; and a second tray holding section for holding a tray having a width several times as large as said unit width, said first and second tray holding sections being arranged in parallel with each other.

7. The assembling device according to claim 5, wherein said tray has a first local shape on an outer surface thereof, and each tray holding section has a second local shape that fits into said first local shape so that each tray is positioned onto each tray holding section with said first local shape and said second local shape being fitted to each other.

8. The tray system used in an assembling device according to claim 5, comprising:

(a) a group of tray main bodies, and (b) a group of holding members, each of which has a predetermined upper surface recessed section that is allowed to fit to the shape of an object to be housed, and is housed in said tray main body so as to hold said object to be housed while positioning it in said upper surface recessed section, said group of the tray main bodies comprising:

(a-1) tray main bodies of a single size having a predetermined unit housing width;

(a-2) tray main bodies of a double size having double said unit housing width, and the group of the holding members comprising:

(b-1) a set of holding members of a single size, each of which is alone fitted to the inside of said tray main body of the single size and housed therein, while any desired one of pairs of the holding members of the single size is housed inside said tray main body of the double size, and (b-2) holding members of a double size, each of which is alone fitted to the inside of said tray main body of the double size, wherein, in the case when any desired one of the pairs of said holding members of the single size are housed in said tray main body of the double size, the tray main body and said desired one of the pairs of said holding members of the single size are positionally fitted to each other in the same manner as in the case when said holding member of the double size is alone housed therein.

9. An assembling device, which fabricates an assembly product by successively assembling a plurality of parts, comprising:

(a) a plurality of robot sections, each constituted by a robot and a base having a rectangular flat face on which the robot is placed, that are aligned with sides of said rectangular shape facing each other, and (b) a workbench aligned between said plurality of robot sections, with each of movable ranges of robots of respective robot sections is allowed to cover at least one portion of each of the workbench adjacent to the robot section.

10. The assembling device according to claim 9, wherein, among said robot sections, respective robots on the adjacent two robot sections are allowed to have different combinations in a degree of freedom in operation.

11. A design assisting device, which is used for designing an operation of an assembling device that manufactures a predetermined assembly product by successively assembling a plurality of parts by using a plurality of robots, comprising:

a data base in which a plurality of operation modules that classify and define handling operations of respective robots for each part are registered;

operation input means for specifying the robot to be used for each process and for selecting an operation module to be used for each process among a collection of operation modules registered in said data base;

execution timing calculation means for calculating execution timing of an operation module selected for each of said assembling process in accordance with the execution sequence of respective processes with respect to said plurality of robots; and display control means for graphically displaying said sequence of execution timing on a predetermined display means along a time axis with respect to each of plurality of said robots.

12. The design assisting device according to claim 11, further comprising:

stand-by time calculation means for calculating a time zone during which each robot is maintained in a stand-by state in order to prevent interference with a previous process in an execution timing for respective operation modules, and stand-by time display controlling means for graphically displaying said stand-by time zones in a manner so as to be distinguished from other time zones.

* * * * *